United States Patent
Ma et al.

(10) Patent No.: US 12,205,008 B2
(45) Date of Patent: Jan. 21, 2025

(54) DROPOUT IN NEUTRAL NETWORKS USING THRESHOLD SWITCHING SELECTORS IN NON-VOLATILE MEMORIES

(71) Applicant: SanDisk Technologies LLC, Addison, TX (US)

(72) Inventors: Wen Ma, Sunnyvale, CA (US); Tung Thanh Hoang, San Jose, CA (US); Martin Lueker-Boden, Fremont, CA (US)

(73) Assignee: SanDisk Technologies LLC, Austin, TX (US)

( * ) Notice: Subject to any disclaimer, the term of this patent is extended or adjusted under 35 U.S.C. 154(b) by 924 days.

(21) Appl. No.: 17/319,518

(22) Filed: May 13, 2021

(65) Prior Publication Data

US 2022/0366211 A1 Nov. 17, 2022

(51) Int. Cl.
*G11C 11/16* (2006.01)
*G06F 3/06* (2006.01)
*G06N 3/04* (2023.01)
*G06N 3/063* (2023.01)
*G06N 5/04* (2023.01)
*G11C 11/54* (2006.01)
*G11C 13/00* (2006.01)

(52) U.S. Cl.
CPC .............. *G06N 3/04* (2013.01); *G06F 3/0604* (2013.01); *G06F 3/0655* (2013.01); *G06F 3/0679* (2013.01); *G06N 3/063* (2013.01); *G06N 5/04* (2013.01); *G11C 11/1657* (2013.01); *G11C 11/1659* (2013.01); *G11C 11/54* (2013.01); *G11C 13/0028* (2013.01); *G11C 13/003* (2013.01)

(58) Field of Classification Search
CPC . G11C 11/1657; G11C 11/1659; G11C 11/54; G11C 13/0028; G11C 13/003
See application file for complete search history.

(56) References Cited

U.S. PATENT DOCUMENTS

| | | | |
|---|---|---|---|
| 7,936,593 | B2 | 5/2011 | Savransky |
| 8,634,247 | B1 | 1/2014 | Sprouse et al. |
| 8,634,248 | B1 | 1/2014 | Sprouse et al. |
| 8,773,909 | B2 | 7/2014 | Li et al. |
| 8,780,632 | B2 | 7/2014 | Sprouse et al. |
| 8,780,633 | B2 | 7/2014 | Sprouse et al. |

(Continued)

OTHER PUBLICATIONS

Rastegari, Mohammad et al., "XNOR-Net: ImageNet Classification Using Binary Convolutional Neural Networks," proceedings ECCV 2016, Aug. 2016, 55 pages.

(Continued)

*Primary Examiner* — Connie C Yoha
(74) *Attorney, Agent, or Firm* — Vierra Magen Marcus LLP

(57) ABSTRACT

A non-volatile memory device is configured for in-memory computation of layers of a neural network by storing weight values as conductance values in memory cells formed of a series combination of a threshold switching selector, such as an ovonic threshold switch, and a programmable resistive element, such as a ReRAM element. By scaling the input voltages (representing inputs for the layer of the neural network) relative to the threshold values of the threshold switching selectors, dropout for inputs can be implemented to reduce overfitting by the neural network.

20 Claims, 22 Drawing Sheets

(56) References Cited

U.S. PATENT DOCUMENTS

| | | |
|---|---|---|
| 8,780,634 B2 | 7/2014 | Sprouse et al. |
| 8,780,635 B2 | 7/2014 | Li et al. |
| 8,792,279 B2 | 7/2014 | Li et al. |
| 8,811,085 B2 | 8/2014 | Sprouse et al. |
| 8,817,541 B2 | 8/2014 | Li et al. |
| 9,098,403 B2 | 8/2015 | Sprouse et al. |
| 9,104,551 B2 | 8/2015 | Spouse et al. |
| 9,116,796 B2 | 8/2015 | Sprouse et al. |
| 9,384,126 B1 | 7/2016 | Sprouse et al. |
| 9,430,735 B1 | 8/2016 | Vali et al. |
| 10,127,150 B2 | 11/2018 | Sprouse et al. |
| 10,192,616 B2 | 1/2019 | O'Toole et al. |
| 10,528,643 B1 | 1/2020 | Choi et al. |
| 10,643,119 B2 | 5/2020 | Chiu et al. |
| 10,643,705 B2 | 5/2020 | Choi et al. |
| 2014/0133228 A1 | 5/2014 | Sprouse et al. |
| 2014/0133233 A1 | 5/2014 | Li et al. |
| 2014/0133237 A1 | 5/2014 | Sprouse et al. |
| 2014/0136756 A1 | 5/2014 | Sprouse et al. |
| 2014/0136757 A1 | 5/2014 | Sprouse et al. |
| 2014/0136758 A1 | 5/2014 | Sprouse et al. |
| 2014/0136760 A1 | 5/2014 | Sprouse et al. |
| 2014/0136762 A1 | 5/2014 | Li et al. |
| 2014/0136763 A1 | 5/2014 | Li et al. |
| 2014/0136764 A1 | 5/2014 | Li et al. |
| 2014/0156576 A1 | 6/2014 | Nugent |
| 2014/0136761 A1 | 7/2014 | Li et al. |
| 2014/0294272 A1 | 10/2014 | Madabhushi et al. |
| 2015/0324691 A1 | 11/2015 | Dropps et al. |
| 2016/0026912 A1 | 1/2016 | Falcon et al. |
| 2017/0098156 A1 | 4/2017 | Nino et al. |
| 2017/0228637 A1 | 8/2017 | Santoro et al. |
| 2018/0039886 A1 | 2/2018 | Umuroglu et al. |
| 2018/0075339 A1 | 3/2018 | Ma et al. |
| 2018/0144240 A1 | 5/2018 | Garbin et al. |
| 2020/0311523 A1 | 10/2020 | Hoang et al. |

OTHER PUBLICATIONS

Wan, Diwen, et al., "TBN: Convolutional Neural Network with Ternary Inputs and Binary Weights," ECCV 2018, Oct. 2018, 18 pages.

Chen, Yu-Hsin, et al., "Eyeriss: An Energy-Efficient Reconfigurable Accelerator for Deep Convolutional Neural Networks," IEEE Journal of Solid-State Circuits, Feb. 2016, 12 pages.

Sun, Xiaoyu, et al., "Fully Parallel RRAM Synaptic Array for Implementing Binary Neural Network with (+1, −1) Weights and (+1, 0) Neurons," 23rd Asia and South Pacific Design Automation Conference, Jan. 2018, 6 pages.

Gonugondla, Sujan K., et al., "Energy-Efficient Deep In-memory Architecture for NAND Flash Memories," IEEE International Symposium on Circuits and Systems (ISCAS), May 2018, 5 pages.

Nakahara, Hiroki, et al., "A Memory-Based Realization of a Binarized Deep Convolutional Neural Network," International Conference on Field-Programmable Technology (FPT), Dec. 2016, 4 pages.

Takeuchi, Ken, "Data-Aware NAND Flash Memory for Intelligent Computing with Deep Neural Network," IEEE International Electron Devices Meeting (IEDM), Dec. 2017, 4 pages.

Mochida, Reiji, et al., "A 4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.

Chiu, Pi-Feng, et al., "A Differential 2R Crosspoint RRAM Array With Zero Standby Current," IEEE Transactions on Circuits and Systems—II: Express Briefs, vol. 62, No. 5, May 2015, 5 pages.

Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.

Liu, Rui, et al., "Parallelizing SRAM Arrays with Customized Bit-Cell for Binary Neural Networks," DAC '18, Jun. 2018, 6 pages.

Courbariaux, Matthieu, et al., "Binarized Neural Networks: Training Neural Networks with Weights and Activations Constrained to +1 or −1," arXiv.org, Mar. 2016, 11 pages.

U.S. Appl. No. 62/702,713, filed Jul. 24, 2018.

DROPOUT IN NEUTRAL NETWORKS USING THRESHOLD SWITCHING SELECTORS IN NON-VOLATILE MEMORIES

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWING

Like-numbered elements refer to common components in the different figures.

DETAILED DESCRIPTION

When training large neural networks on small data sets, "overfitting" can occur, where too many parameters are determined based on too little data, so that the neural network learns to recognize the specific examples of the data set rather than noticing and extracting general features of the data set. One approach to avoid overfitting is by use of dropout, where some of the inputs of a layer for the neural network are set to zero. The following presents techniques for performing dropout when implementing a neural network through in-memory computation using a memory array in which the memory cells include a threshold switching selector in series with a programmable resistance element.

In embodiments described in the following, weights of a layer of a neural network are stored as conductance values in the memory cells of one or more arrays, where the memory cells are formed of a threshold switching selector in series with a programmable resistance element, such as in a resistive random access memory (ReRAM). The inputs for layers of the neural network are encoded as voltage levels applied to the memory array. By scaling the input voltages relative to the threshold voltage of the threshold switching selectors, the input voltages whose values are less than the threshold voltage will be dropped out for the layer. The output of one layer can then be scaled and used as the input to the next layer, propagating the initial input neural network with dropout. Based on the output of the neural network, weight values of the layers can be selectively reprogrammed as part of a training process.

Figure 1:
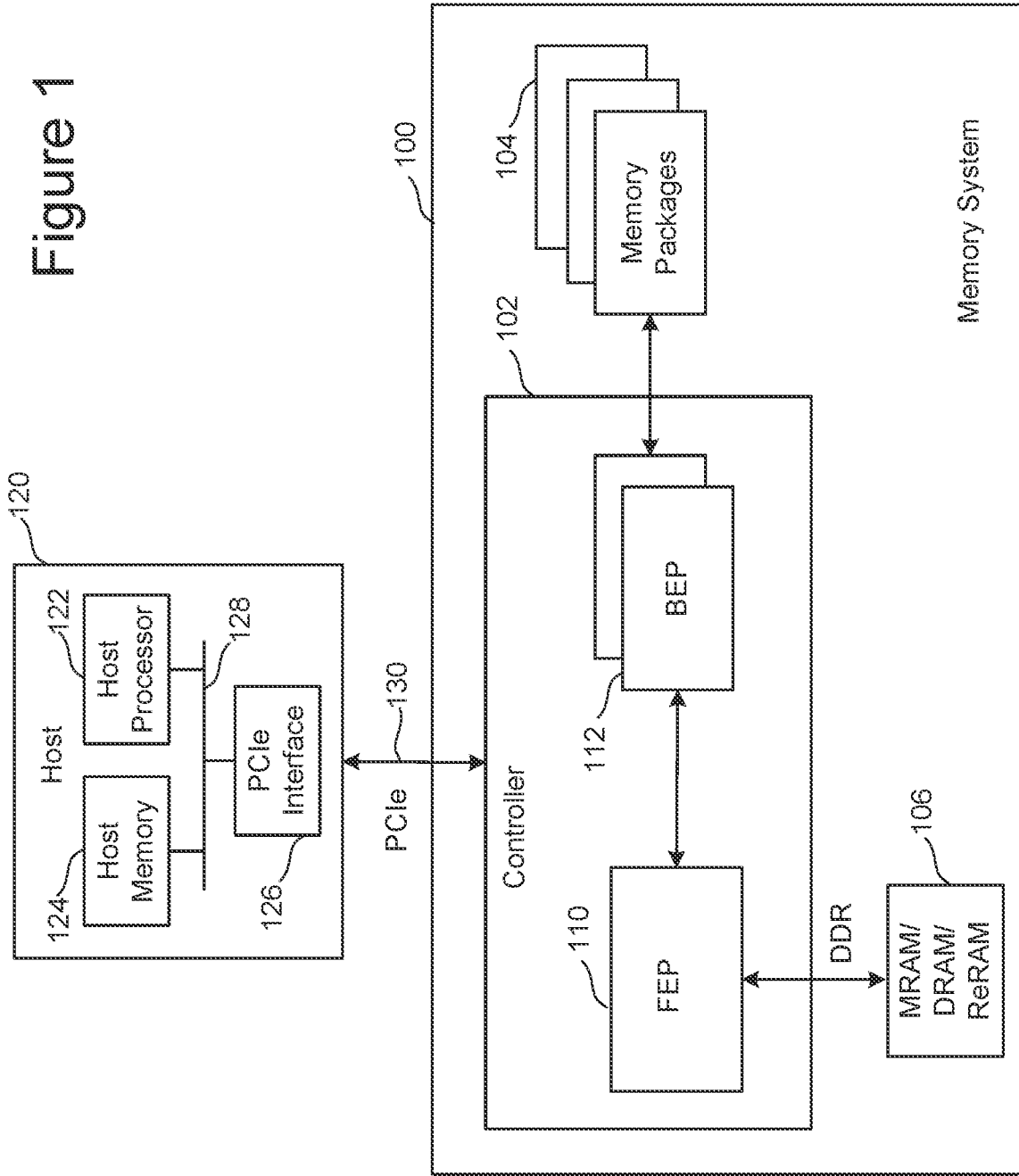
FIG. 1 is a block diagram of one embodiment of a memory system connected to a host.

FIG. 1 is a block diagram of one embodiment of a memory system 100 connected to a host 120. Memory system 100 can implement the technology presented herein for neural network operation. Many different types of memory systems can be used with the technology proposed herein. Example memory systems include solid state drives ("SSDs"), memory cards including dual in-line memories (DIMMs) for DRAM replacement, and embedded memory devices; however, other types of memory systems can also be used.

Memory system 100 of FIG. 1 comprises a controller 102, non-volatile memory 104 for storing data, and local memory (e.g., DRAM/ReRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In another embodiment, the BEP or FEP is included on the memory die.

Controller 102 communicates with host 120 via an interface 130 that implements a protocol such as, for example, NVM Express (NVMe) over PCI Express (PCIe) or using JEDEC standard Double Data Rate (DDR) or Low-Power Double Data Rate (LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, non-volatile memory, or another type of storage. Host 120 is external to and separate from memory system 100. In one embodiment, memory system 100 is embedded in host 120.

Figure 2:
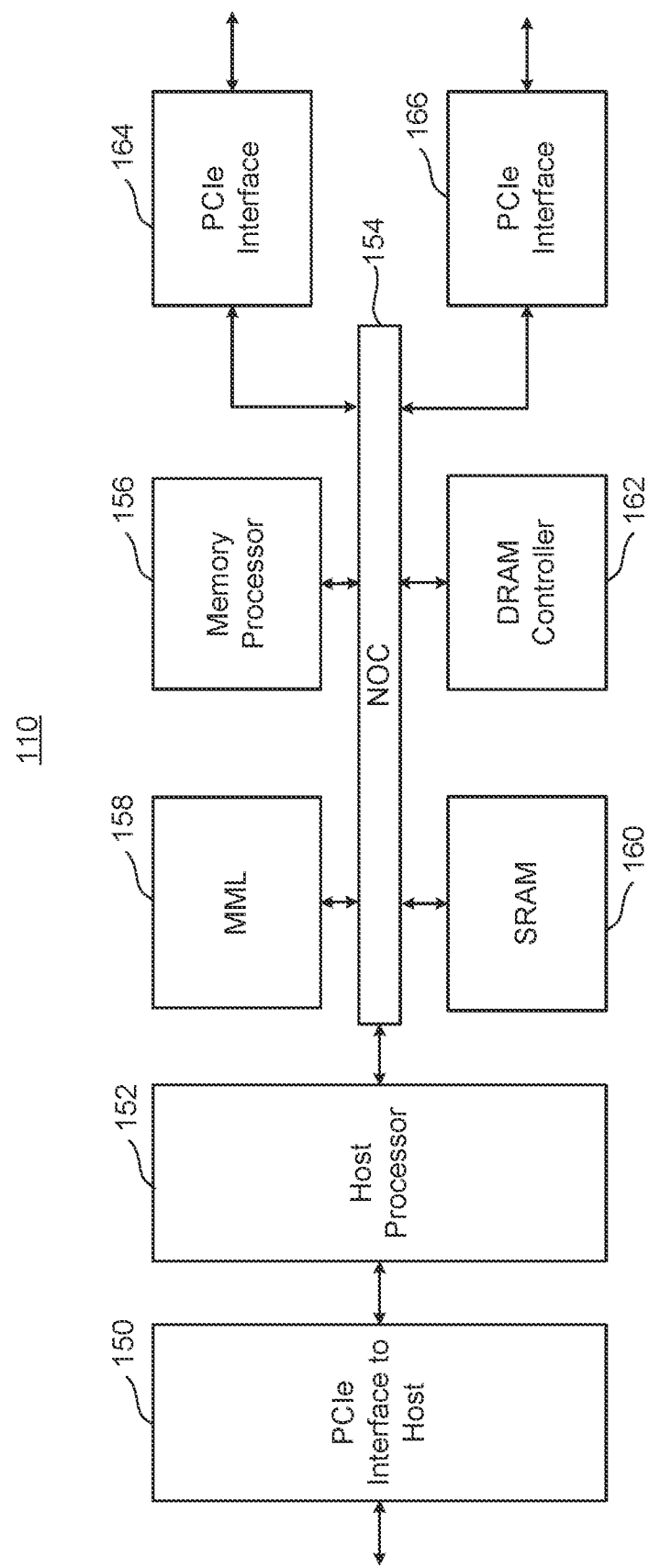
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 502/602 of FIGS. 5 and 6 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
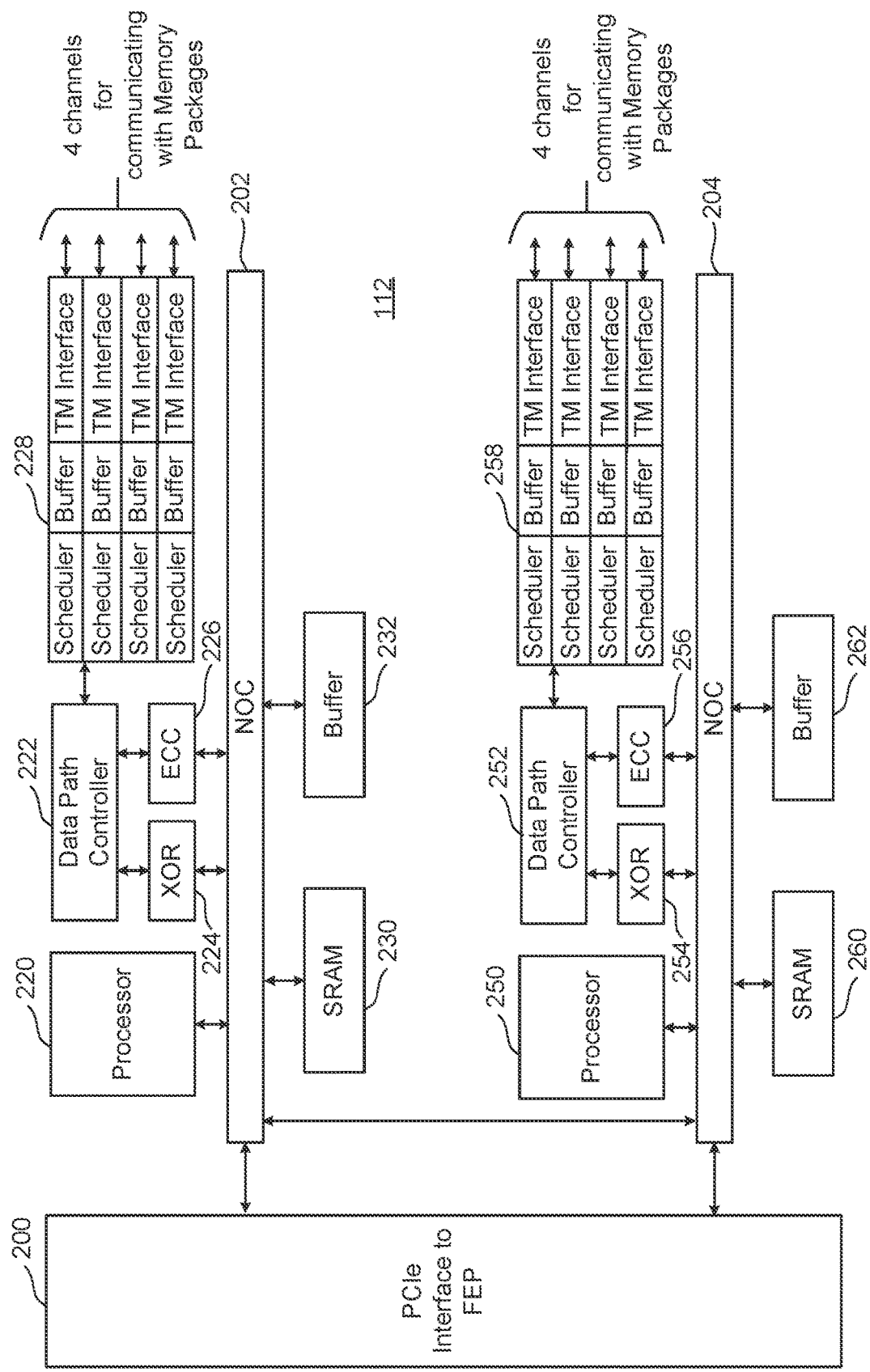
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
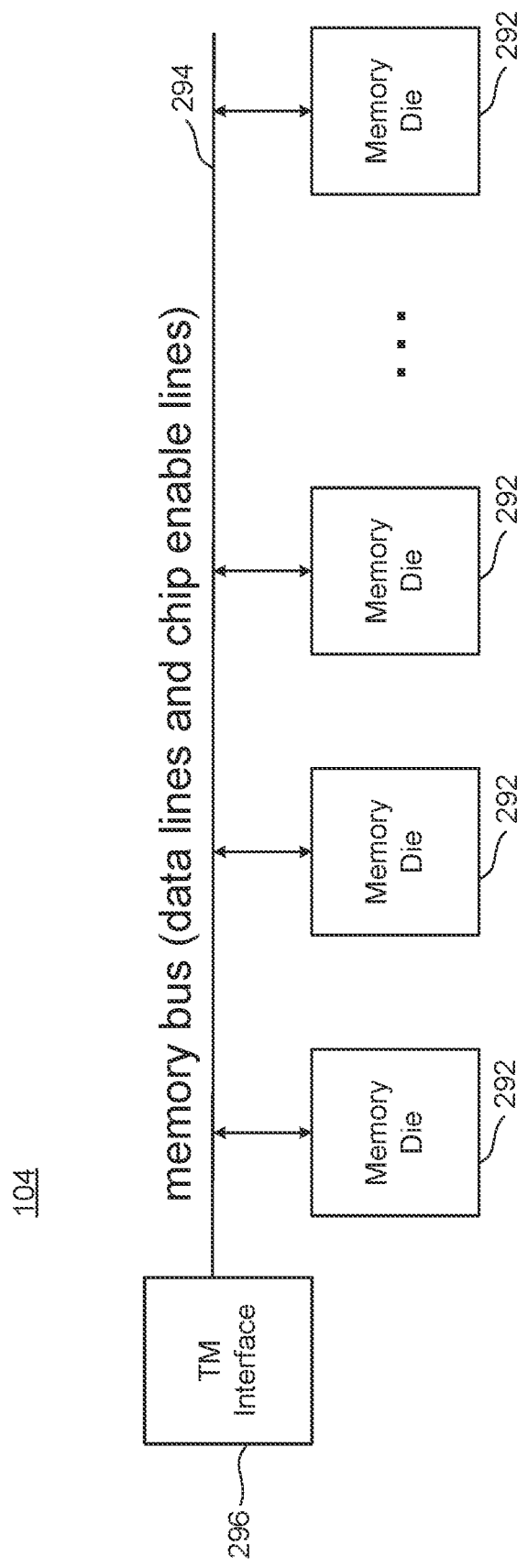
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 5:
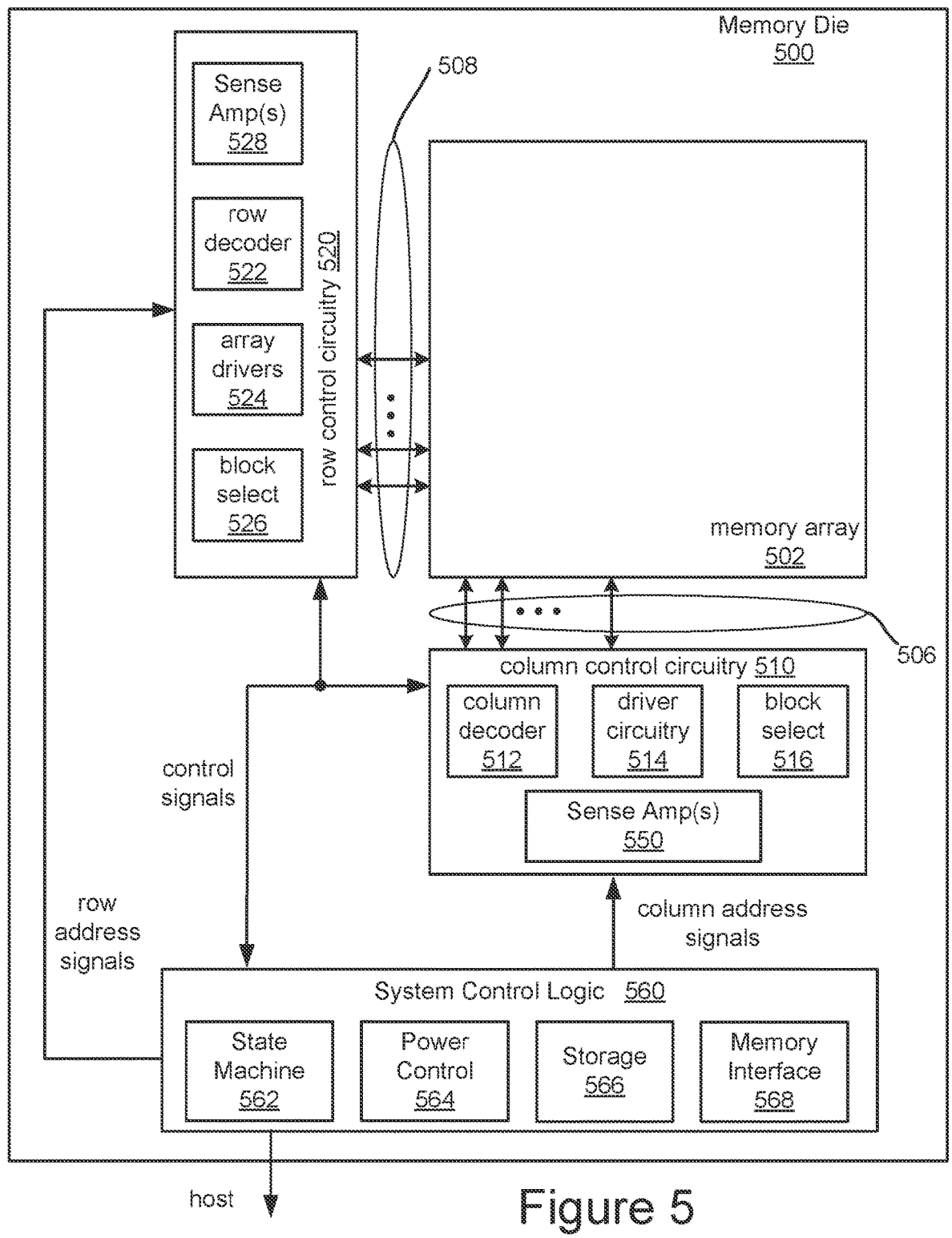
FIG. 5 is a block diagram of one embodiment of a memory die.

FIG. 5 is a block diagram that depicts one example of a memory die 500 that can implement the technology described herein. Memory die 500, which can correspond to one of the memory die 292 of FIG. 4, includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory die 500 includes row control circuitry 520, whose outputs 508 are connected to respective word lines of the memory array 502. Row control circuitry 520 receives a group of M row address signals and one or more various control signals from System Control Logic circuit 560, and typically may include such circuits as row decoders 522, array terminal drivers 524, and block select circuitry 526 for both reading and writing operations. Row control circuitry 520 may also include read/write circuitry. In an embodiment, row control circuitry 520 has sense amplifiers 528, which each contain circuitry for sensing a condition (e.g., voltage) of a word line of the memory array 502. In an embodiment, by sensing a word line voltage, a condition of a memory cell in a cross-point array is determined. Memory die 500 also includes column control circuitry 510 whose input/outputs 506 are connected to respective bit lines of the memory array 502. Although only single block is shown for array 502, a memory die can include multiple arrays or "tiles" that can be individually accessed. Column control circuitry 510 receives a group of N column address signals and one or more various control signals from System Control Logic 560, and typically may include such circuits as column decoders 512, array terminal receivers or drivers 514, block select circuitry 516, as well as read/write circuitry, and I/O multiplexers.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine 562 that provides die-level control of memory operations. In one embodiment, the state machine 562 is programmable by software. In other embodiments, the state machine 562 does not use software and is completely implemented in hardware (e.g., electrical circuits). In another embodiment, the state machine 562 is replaced by a micro-controller or microprocessor, either on or off the memory chip. The system control logic 560 can also include a power control module 564 controls the power and voltages supplied to the rows and columns of the memory 502 during memory operations and may include charge pumps and regulator circuit for creating regulating voltages. System control logic 560 includes storage 566, which may be used to store parameters for operating the memory array 502.

Commands and data are transferred between the controller 102 and the memory die 500 via memory controller interface 568 (also referred to as a "communication interface"). Memory controller interface 568 is an electrical interface for communicating with memory controller 102. Examples of memory controller interface 568 include a Toggle Mode Interface and an Open NAND Flash Interface (ONFI). Other I/O interfaces can also be used. For example, memory controller interface 568 may implement a Toggle Mode Interface that connects to the Toggle Mode interfaces of memory interface 228/258 for memory controller 102. In one embodiment, memory controller interface 568 includes a set of input and/or output (I/O) pins that connect to the controller 102.

In some embodiments, all of the elements of memory die 500, including the system control logic 560, can be formed as part of a single die. In other embodiments, some or all of the system control logic 560 can be formed on a different die.

For purposes of this document, the phrase "one or more control circuits" can include a controller, a state machine, a micro-controller and/or other control circuitry as represented by the system control logic 560, or other analogous circuits that are used to control non-volatile memory.

In one embodiment, memory structure 502 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 502 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 502 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 502 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the structure of memory structure 502 of the memory cells and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
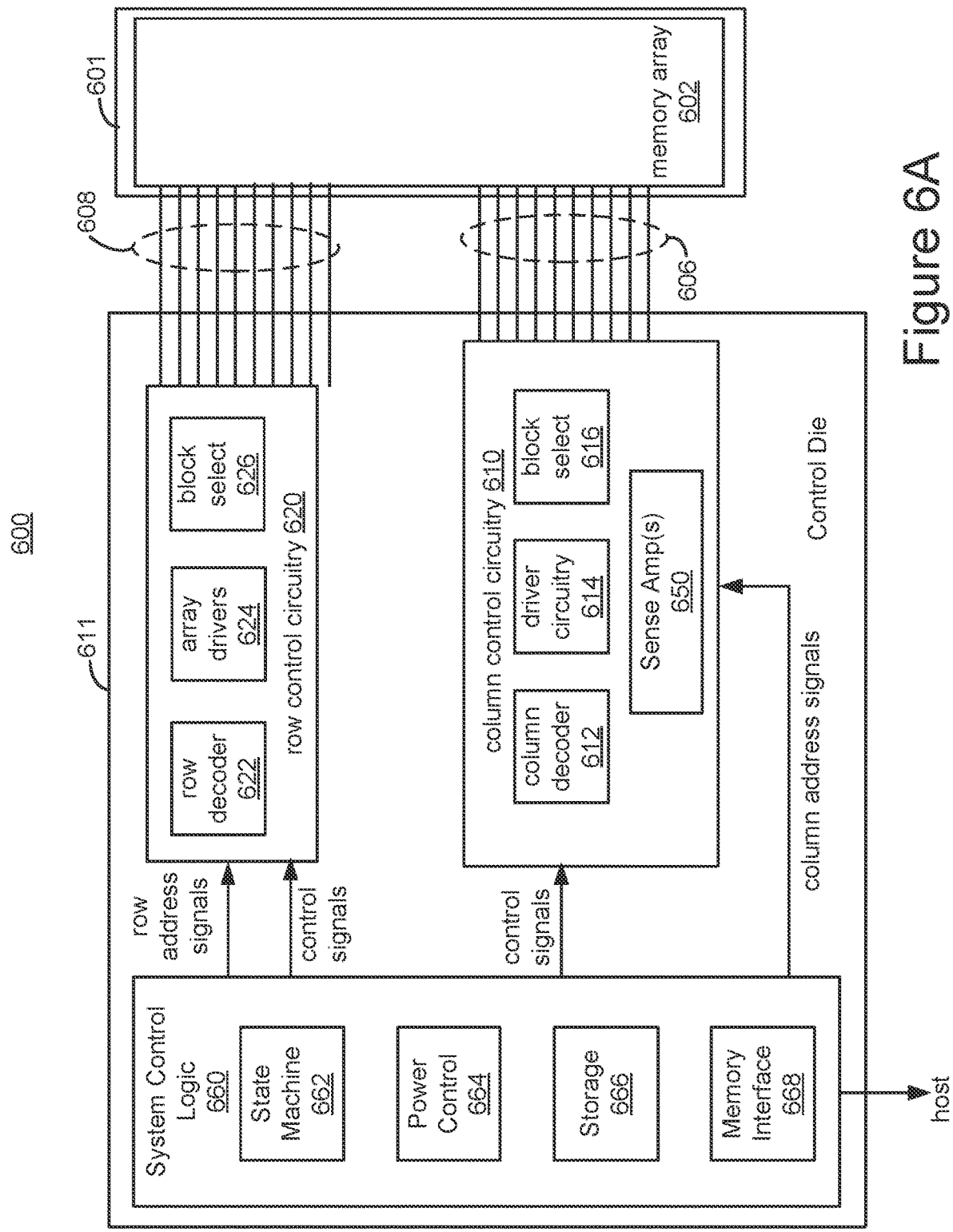
FIGS. 6A and 6B illustrate an example of control circuits coupled to a memory structure through wafer-to-wafer bonding.
Figure 6B:
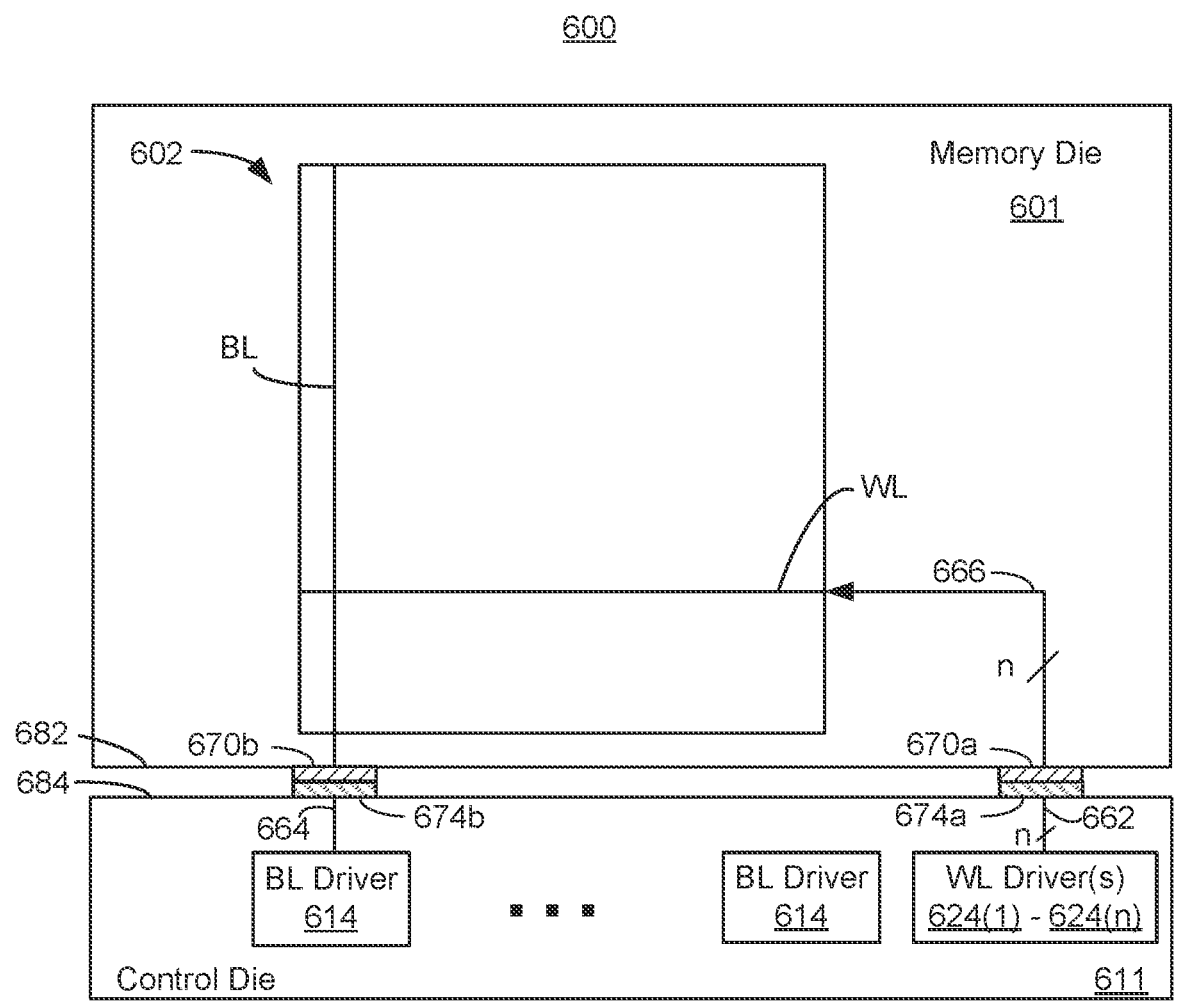

FIGS. 6A and 6B show an alternative arrangement to that of FIG. 5, which may be implemented using wafer-to-wafer bonding to provide a bonded die pair for memory system 600. FIG. 6A shows an example of the peripheral circuitry, including control circuits, formed in a peripheral circuit or control die 611 coupled to memory structure 602 formed in memory die 601. As with 502 of FIG. 5, the memory die 601 can include multiple independently accessible arrays or "tiles". Common components are labelled similarly to FIG. 5 (e.g., 502 is now 602, 510 is now 610, and so on). It can be seen that system control logic 660, row control circuitry 620, and column control circuitry 610 are located in control die 611. In some embodiments, all or a portion of the column control circuitry 610 and all or a portion of the row control circuitry 620 are located on the memory structure die 601. In some embodiments, some of the circuitry in the system control logic 660 is located on the on the memory structure die 601.

System control logic 660, row control circuitry 620, and column control circuitry 610 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die 292 may reduce the number of steps needed to fabricate such a die, adding such circuits to a die such as control die 611 may not require any additional process steps.

FIG. 6A shows column control circuitry 610 on the control die 611 coupled to memory structure 602 on the memory structure die 601 through electrical paths 606. For example, electrical paths 606 may provide electrical connection between column decoder 612, driver circuitry 614, and block select 616 and bit lines of memory structure 602. Electrical paths may extend from column control circuitry 610 in control die 611 through pads on control die 611 that are bonded to corresponding pads of the memory structure die 601, which are connected to bit lines of memory structure 602. Each bit line of memory structure 602 may have a corresponding electrical path in electrical paths 606, including a pair of bond pads, which connects to column control circuitry 610. Similarly, row control circuitry 620, including row decoder 622, array drivers 624, block select 626, and sense amplifiers 628 are coupled to memory structure 602 through electrical paths 608. Each of electrical path 608 may correspond to a word line, dummy word line, or select gate line. Additional electrical paths may also be provided between control die 611 and memory die 601.

For purposes of this document, the phrase "control circuit" can include one or more of controller 102, system control logic 660, column control circuitry 610, row control circuitry 620, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

FIG. 6B is a block diagram showing more detail on the arrangement of one embodiment of the integrated memory assembly of bonded die pair 600. Memory die 601 contains a plane or array 602 of memory cells. The memory die 601 may have additional planes or arrays. One representative bit line (BL) and representative word line (WL) 666 is depicted for each plane or array 602. There may be thousands or tens of thousands of such bit lines per each plane or array 602. In one embodiment, an array or plane represents a groups of connected memory cells that share a common set of unbroken word lines and unbroken bit lines.

Control die 611 includes a number of bit line drivers 614. Each bit line driver 614 is connected to one bit line or may be connected to multiple bit lines in some embodiments. The control die 611 includes a number of word line drivers 624(1)-624(n). The word line drivers 624(1)-624(n) are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 624 provide voltages to the word lines in memory die 601. As discussed above with respect to FIG. 6A, the control die 611 may also include charge pumps, voltage generators, and the like that are not represented in FIG. 6B, which may be used to provide voltages for the word line drivers 624 and/or the bit line drivers 614.

The memory die 601 has a number of bond pads 670a, 670b on a first major surface 682 of memory die 601. There may be "n" bond pads 670a, to receive voltages from a corresponding "n" word line drivers 624(1)-624(n). There may be one bond pad 670b for each bit line associated with array 602. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 600. For example, the data bus between the memory controller 102 and the integrated memory assembly 600 may, for example, provide for eight, sixteen, or perhaps 32 bits to be transferred in parallel. However, the data bus between the memory controller 102 and the integrated memory assembly 600 is not limited to these examples.

The control die 611 has a number of bond pads 674a, 674b on a first major surface 684 of control die 611. There may be "n" bond pads 674a, to deliver voltages from a corresponding "n" word line drivers 624(1)-624(n) to memory die 601. There may be one bond pad 674b for each bit line associated with array 602. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 601 to the control die 611. Also, the bond pads 670, 674 permit internal signal transfer between the memory die 601 and the control die 611. Thus, the memory die 601 and the control die 611 are bonded together with bond pads. Although FIG. 6A depicts one control die 611 bonded to one memory die 601, in another embodiment one control die 611 is bonded to multiple memory dies 601.

Herein, "internal signal transfer" means signal transfer between the control die 611 and the memory die 601. The internal signal transfer permits the circuitry on the control die 611 to control memory operations in the memory die 601. Therefore, the bond pads 670, 674 may be used for memory operation signal transfer. Herein, "memory operation signal transfer" refers to any signals that pertain to a memory operation in a memory die 601. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier may be electrically connected to bond pad 674b by pathway 664. Relative to FIG. 6A, the electrical paths 606 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 608 can correspond to the pathway 662, the bond pads 674a, and bond pads 670a. Note that pathways 662 may comprise a separate conductive pathway for each word line driver 624(1)-624(n). Likewise, a there may be a separate bond pad 674a for each word line driver 624(1)-624(n). The word lines in block 2 of the memory die 601 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 5 or on the control die 611 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

In the following discussion, the memory array 502/602 of FIGS. 5 and 6A will mainly be discussed in the context of a cross-point architecture, although much of the discussion can be applied more generally. In a cross-point architecture, a first set of conductive lines or wires, such as word lines, run in a first direction relative to the underlying substrate and a second set of conductive lines or wires, such a bit lines, run in a second relative to the underlying substrate. The memory cells are sited at the intersection of the word lines and bit lines. The memory cells at these cross-points can be formed according to any of a number of technologies, including those described above. The following discussion will mainly focus on embodiments based on a cross-point architecture using MRAM memory cells.

Figure 7A:
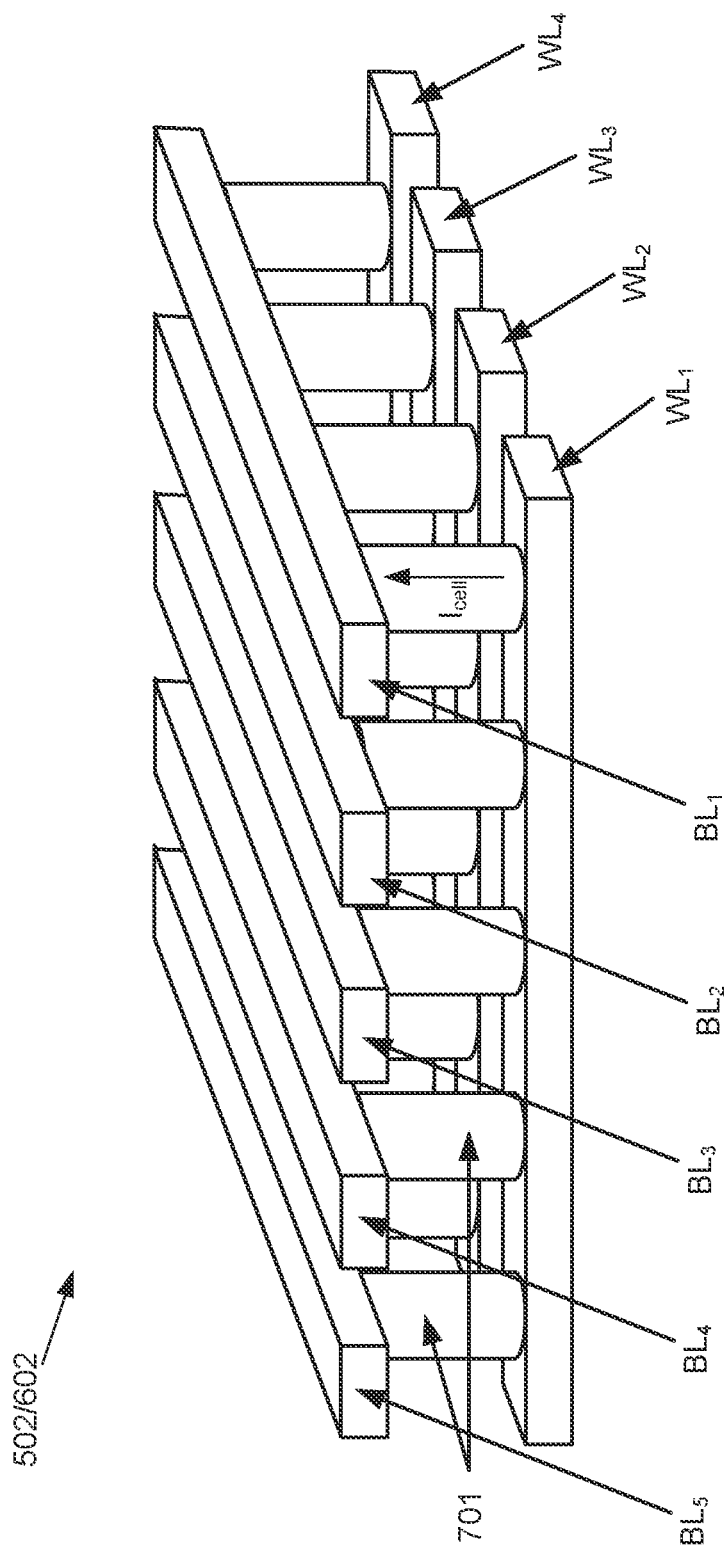
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502/602 of FIG. 7A is one example of an implementation for memory array 502 in FIG. 5 or 602 in FIG. 6A, where a memory die can include multiple such array structures. The bit lines $BL_1$-$BL_5$ are arranged in a first direction (represented as running into the page) relative to an underlying substrate (not shown) of the die and the word lines $WL_1$-$WL_5$ are arranged in a second direction perpendicular to the first direction. FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, or other material with a programmable resistance. The following discussion will focus on MRAM memory cells, although much of the discussion can be applied more generally. The current in the memory cells of the first memory level is shown as flowing upward as indicated by arrow $I_{cell}$, but current can flow in either direction, as is discussed in more detail in the following.

Figure 7B:
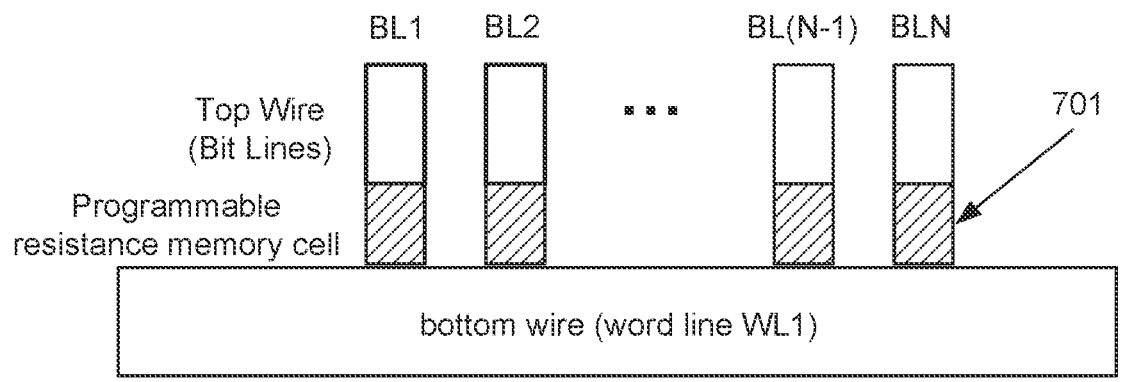
FIGS. 7B and 7C respectively present side and top views of the cross-point structure in FIG. 7A.
Figure 7C:
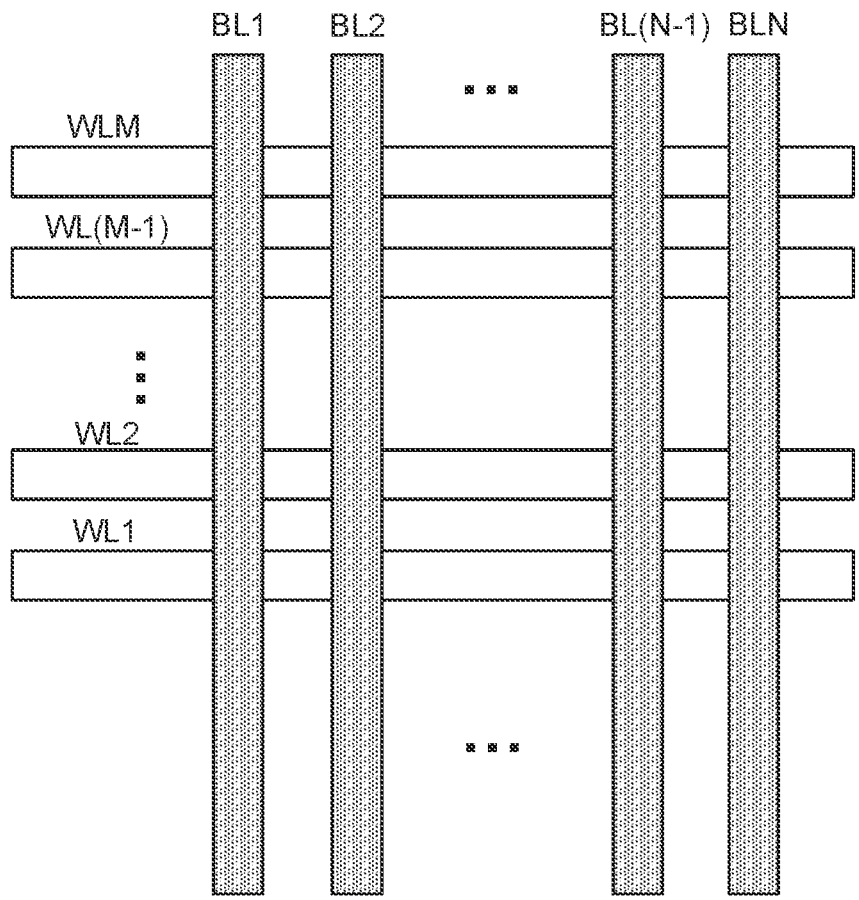

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell 701, although PCM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of at least two resistance states: high and low. More detail on embodiments for an MRAM memory cell design and techniques for their programming are given below.

The cross-point array of FIG. 7A illustrates an embodiment with one layer of word lines and bits lines, with the MRAM or other memory cells sited at the intersection of the two sets of conducting lines. To increase the storage density of a memory die, multiple layers of such memory cells and conductive lines can be formed. A 2-layer example is illustrated in FIG. 7D.

Figure 7D:
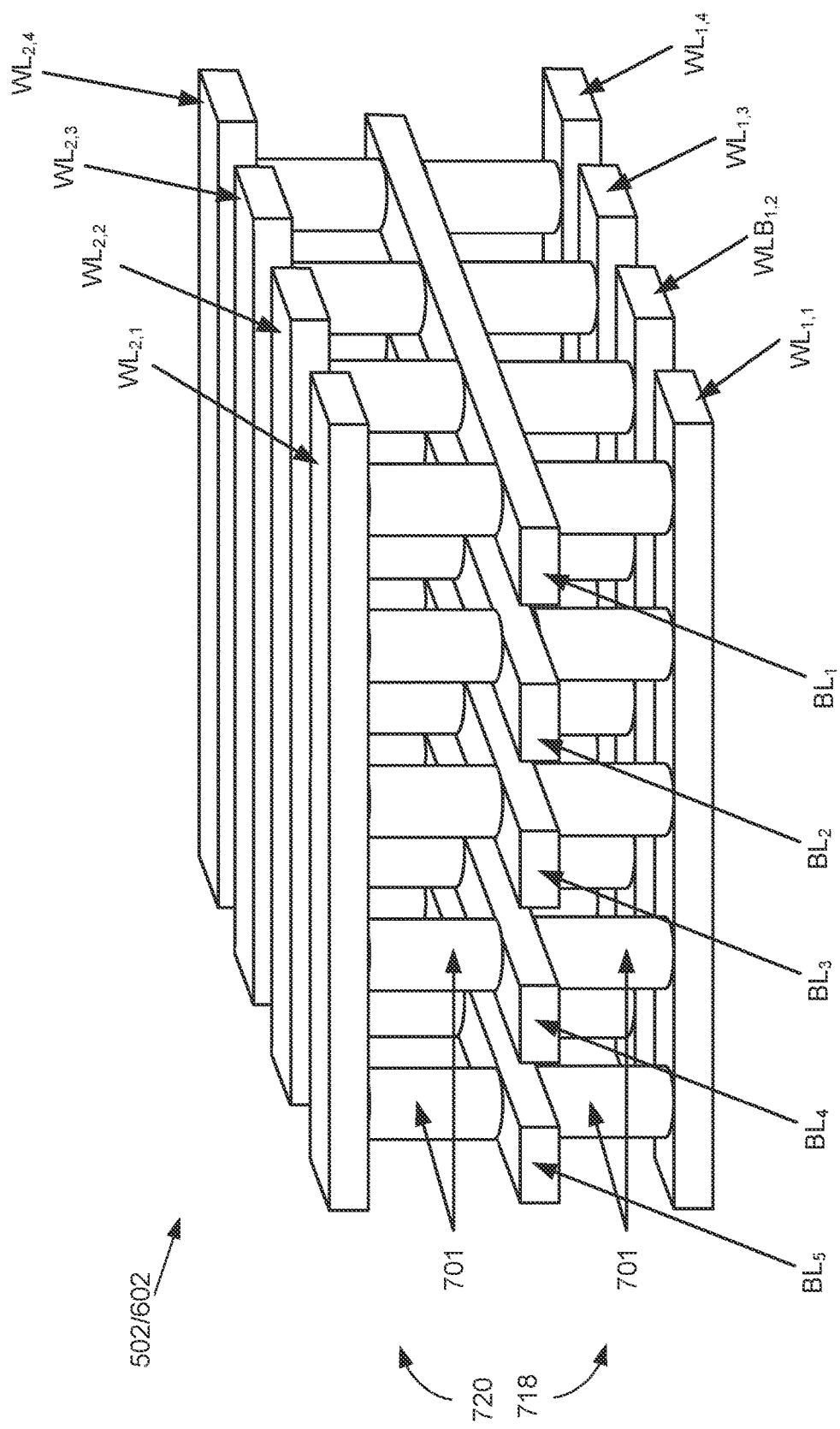
FIG. 7D depicts an embodiment of a portion of a two level memory array that forms a cross-point architecture in an oblique view.

FIG. 7D depicts an embodiment of a portion of a two level memory array that forms a cross-point architecture in an oblique view. As in FIG. 7A, FIG. 7D shows a first layer 718 of memory cells 701 of an array 502/602 connected at the cross-points of the first layer of word lines $WL_{1,1}$-$WL_{1,4}$ and bit lines $BL_1$-$BL_5$. A second layer of memory cells 720 is formed above the bit lines $BL_1$-$BL_5$ and between these bit lines and a second set of word lines $WL_{2,1}$-$WL_{2,4}$. Although FIG. 7D shows two layers, 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around. The two layers can be structured to have current flow in the same direction in each layer for a given operation or to have current flow in the opposite directions.

The use of a cross-point architecture allows for arrays with a small footprint and several such arrays can be formed on a single die. The memory cells formed at each cross-point can a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both. Resistive type memory cells can be formed according to many of the technologies mentioned above, such as ReRAM, FeRAM, PCM, or MRAM. The following discussion is presented mainly in the context of memory arrays using a cross-point architecture with binary valued MRAM memory cells, although much of the discussion is more generally applicable.

Turning now to types of data that can be stored in non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 8:
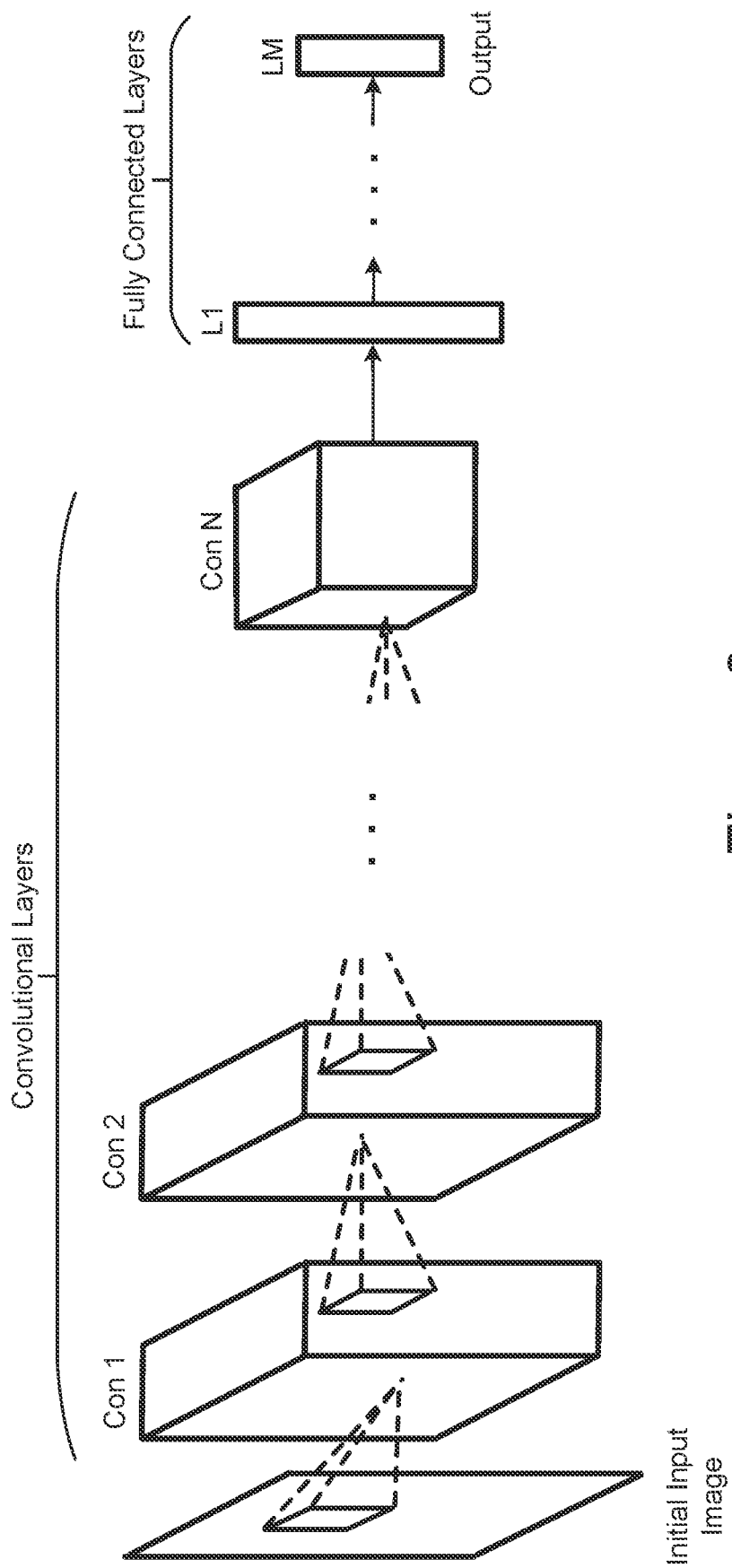
FIG. 8 illustrates a simple example of a convolutional neural network (CNN).

FIG. 8 is a schematic representation of an example of a CNN. FIG. 8 illustrates an initial input image of an array of pixel values, followed by a number of convolutional layers that are in turn followed by a number of fully connected layers, the last of which provides the output. Each neuron in the first convolutional layer (Con 1) takes as input data from an n×n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con 1 to Con N) using each layer's learned weights, after which it is propagated through the fully connected layers (L1 to LM) using their learned weights.

Figure 9:
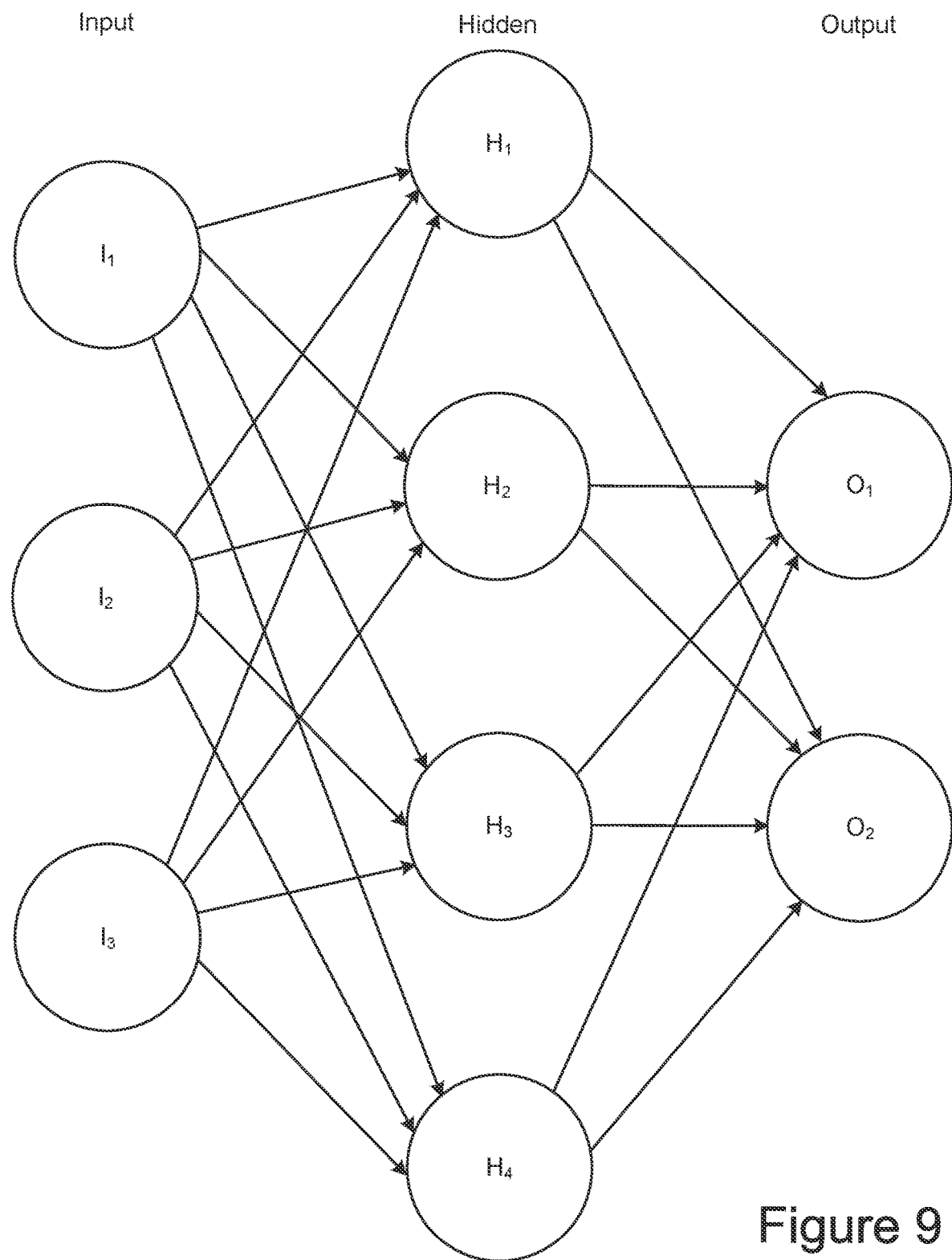
FIG. 9 illustrates a simple example of fully connected layers in an artificial neural network.

FIG. 9 represents several fully connected layers of a neural network in more detail. In FIG. 9, the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually, each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer) to the last layer (the output layer), possibly after traversing the layers multiple times. Although FIG. 8 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 10B:
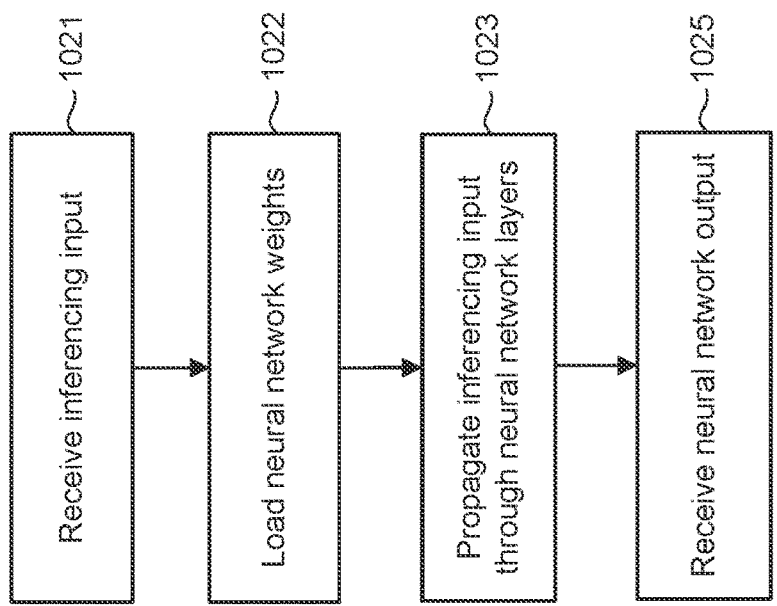
FIG. 10B is a flowchart describing one embodiment of a process for inference using a neural network.
Figure 10A:
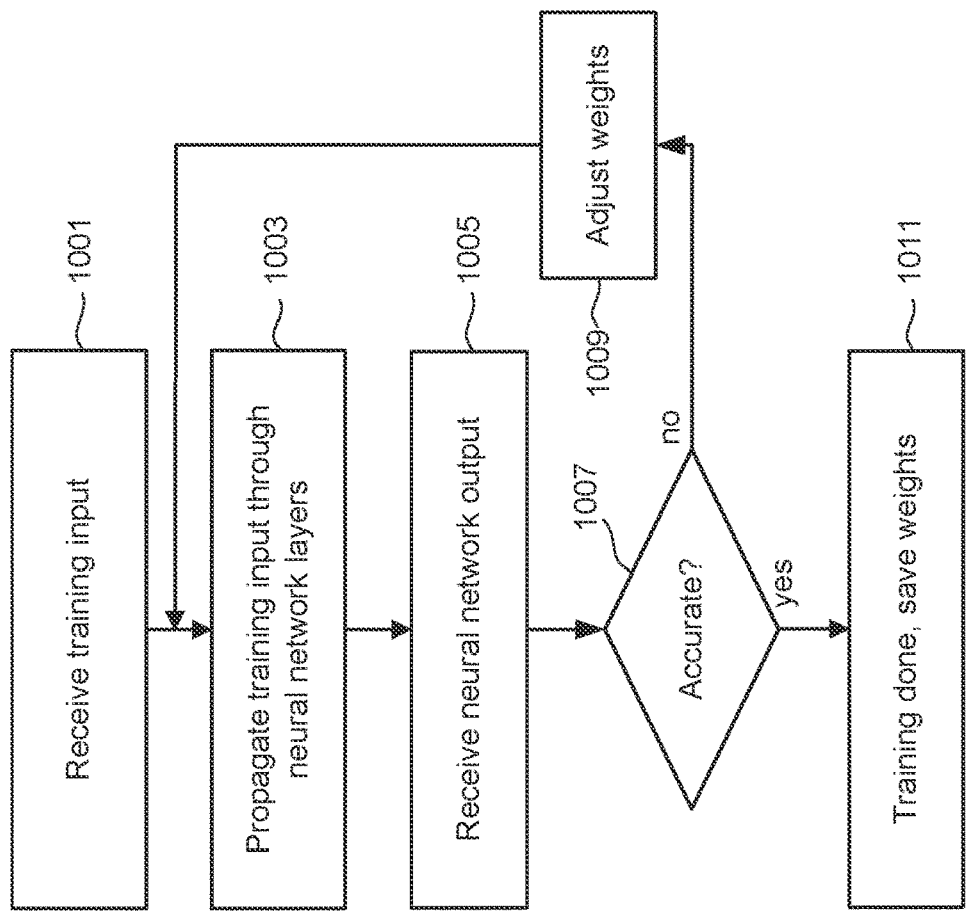
FIG. 10A is a flowchart describing one embodiment of a process for training a neural network to generate a set of weights.

FIG. 10A is a flowchart describing one embodiment of a process for training a neural network to generate a set of weights. The training process is often performed in the cloud, allowing additional or more powerful processing to be accessed. At step 1001, the input, such as a set of images, is received (e.g., the image input in FIG. 8). At step 1003 the input is propagated through the layers connecting the input to the next layer (e.g., CON1 in FIG. 8) using the current filter, or set of weights. The neural network's output is then received at the next layer (e.g., CON2 in FIG. 8) in step 1005, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 1005. A user can then review the results at step 1007 to select which probabilities the neural network should return and decide whether the current set of weights supply a sufficiently accurate labelling and, if so, the training is complete (step 1011). If the result is not sufficiently accurate, the neural network adjusts the weights at step 1009 based on the probabilities the user selected, followed by looping back to step 1003 to run the input data again with the adjusted weights. Once the neural network's set of weights have been determined, they can be used to "inference," which is the process of using the determined weights to generate an output result from data input into the neural network. Once the weights are determined at step 1011, they can then be stored in non-volatile memory for later use, where the storage of these weights in non-volatile memory is discussed in further detail below.

FIG. 10B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 1021, the input is received, such as the image of a dog in the example used above. If the previously determined weights are not present in the device running the neural network application, they are loaded at step 1022. For example, on a host processor executing the neural network, the weights could be read out of an SSD in which they are stored and loaded into RAM on the host device. At step 1023, the input data is then propagated through the neural network's layers. Step 1023 will be similar to step 1003 of FIG. 10B, but now using the weights established at the end of the training process at step 1011. After propagating the input through the intermediate layers, the output is then provided at step 1025.

Figure 11:
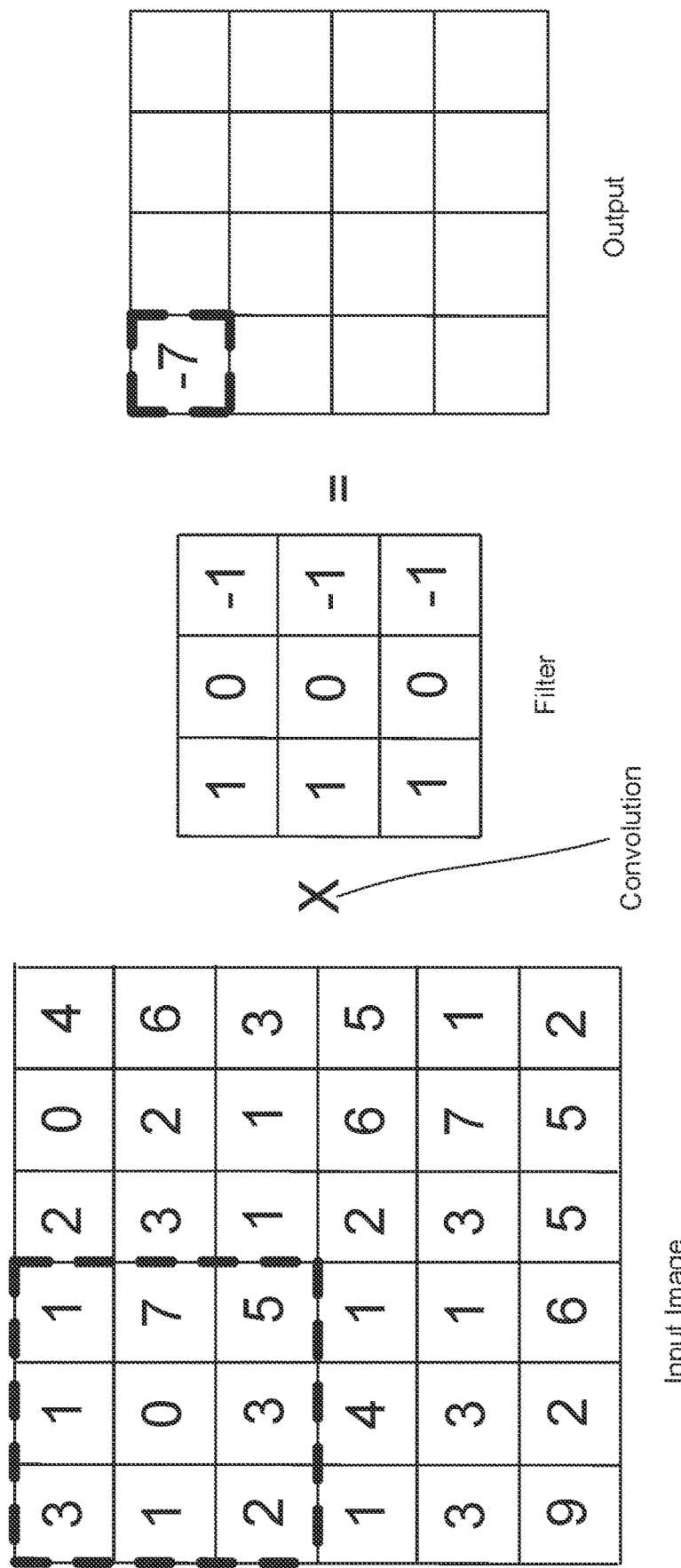
FIG. 11 is a schematic representation of a convolution operation in a convolutional neural network.

FIG. 11 is a schematic representation of a convolution operation between an input image and filter, or set of weights. In this example, the input image is a 6×6 array of pixel values and the filter is a 3×3 array of weights. The convolution operation is performed by a matrix multiplication of the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

Figure 12:
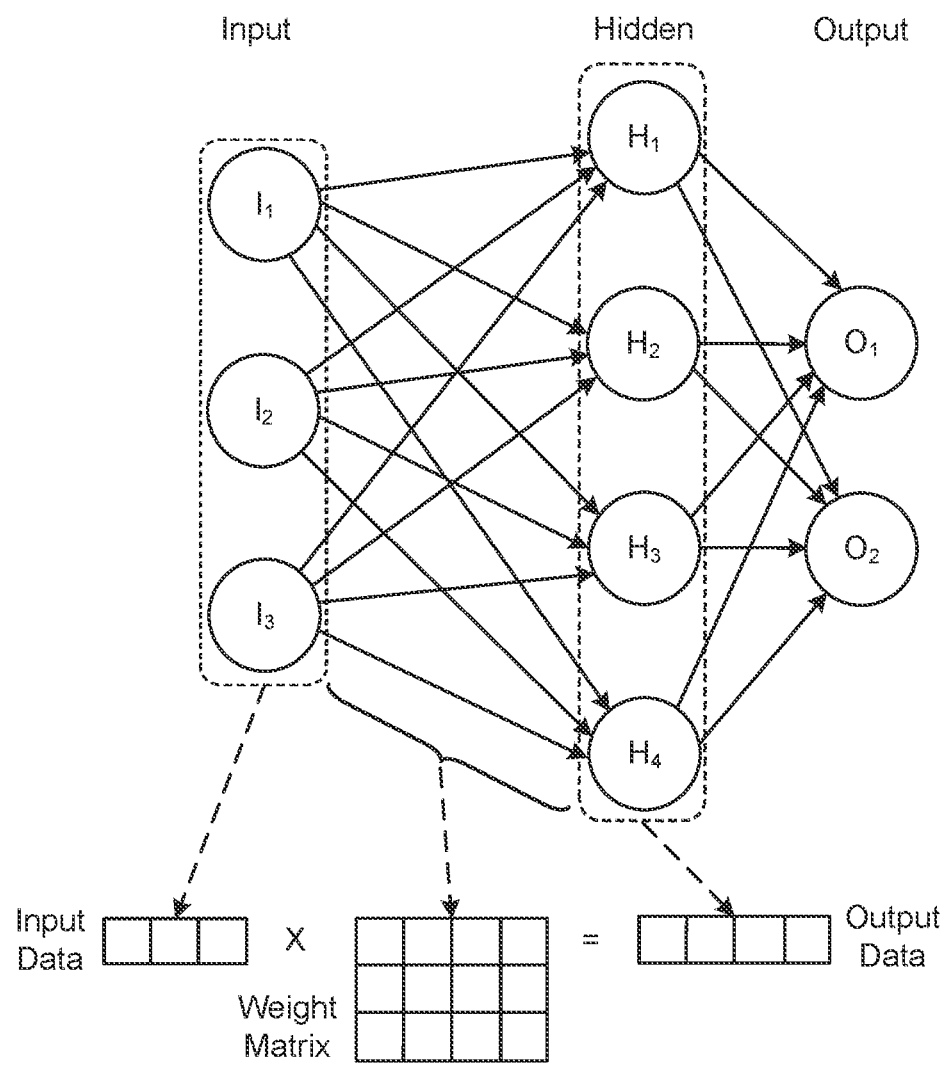
FIG. 12 is a schematic representation of the use of matrix multiplication in a fully connected layer of a neural network.

FIG. 12 is a schematic representation of the use of matrix multiplication in a fully connected layer of a neural network. Matrix multiplication, or MatMul, is a commonly used approach in both the training and inference phases for neural networks and is used in kernel methods for machine learning. FIG. 12 at the top is similar to FIG. 9, where only a single hidden layer is shown between the input layer and the output layer. The input data is represented as a vector of a length corresponding to the number of input nodes. The weights are represented in a weight matrix, where the number of columns corresponds to the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

One problem that can arise when training large neural networks on small datasets is that the process can "overfit" the training data. Overfitting is a phenomenon where the trained neural network model too closely corresponds to a particular set of data, applying too many parameters to too small of a data set so that the neural network may not accurately fit additional data or provide accurate inferencing. One approach for dealing with overfitting is through use of ensembles of neural networks with different model configurations. An ensemble approach can reduce overfitting, but requires additional computation and memory. By randomly dropping out nodes during training, a training process can approximate having different network architectures in parallel, therefore reduce overfitting without the same need for additional computation and memory. The following discussion looks at the use of dropout in neural networks though use of non-volatile memory structures and the properties of threshold switching selectors.

Figure 13:
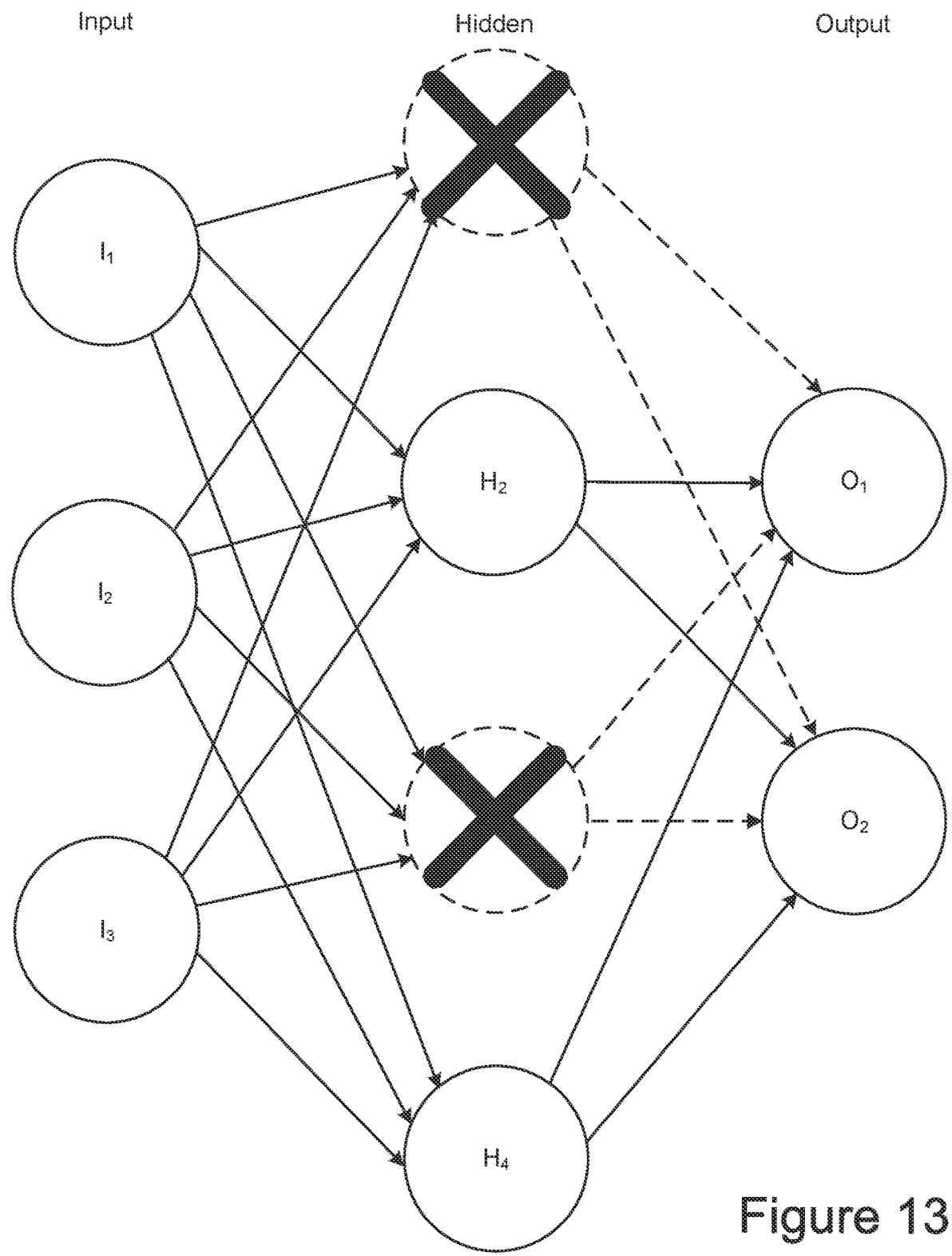
FIG. 13 illustrates the concept of dropout in neural networks.

FIG. 13 illustrates the concept of dropout in neural networks. FIG. 13 illustrates an example of three layers of the artificial neural network, repeating the example of FIG. 9. Like FIG. 9, FIG. 13 again shows an input layer of three nodes ($I_1$, $I_2$, $I_3$), an intermediate hidden layer of four nodes ($H_1$, $H_2$, $H_3$, $H_4$), and two output nodes ($O_1$, $O_2$). By dropping out, in this example, the X-ed out hidden layer nodes $H_1$ and $H_3$, and (as indicated by the broken line) the weights connecting these nodes to the preceding and following layers are not included in the layer so that (as indicated by the broken line) weights connected this to the layer after are not included in the training. This reduces the number of fitting parameters in the current operation and, thus, the likelihood of overfitting. In a typical case, a good value for dropout in a hidden layer is between 0.5 and 0.8, where 1 means no dropout, 0 means all dropped out. Input layers can use a larger dropout rate, such as 0.8.

Figure 14:
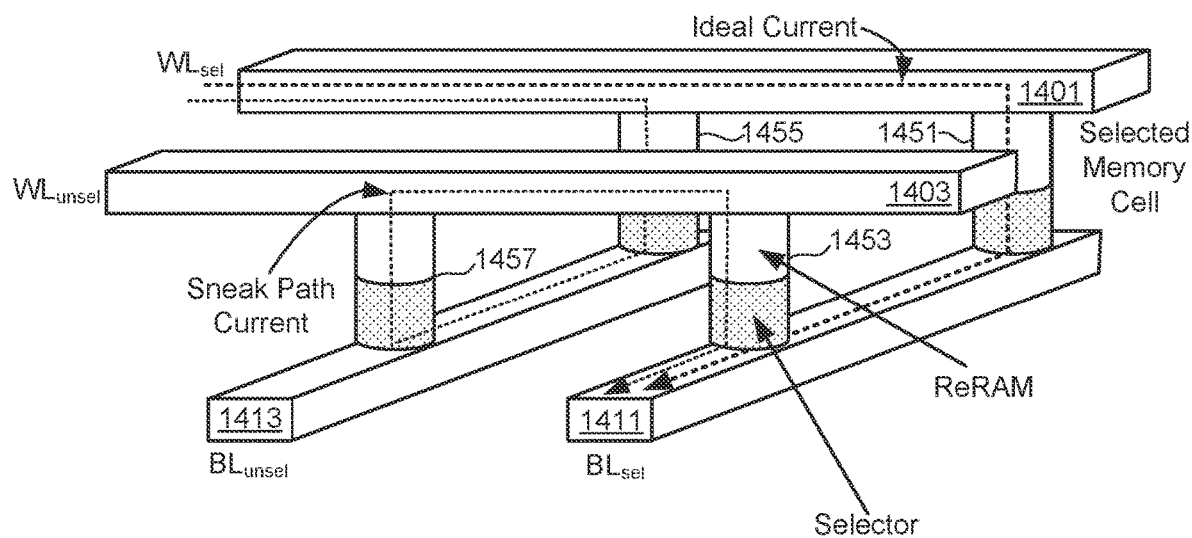
FIG. 14 illustrates a portion of a cross-point, or crossbar, type of memory array.

In a cross-point architecture, such as discussed above with respect to FIGS. 7A-7D, it is common to include a switching device in series with programmable resistance element to form a memory cell 701. Without a switching device, non-selected memory cell may see current flows, leading erroneous read values during sensing and disturbs during programming. The problem can be illustrated with respect to FIG. 14. FIG. 14, and the subsequent figures, are described for an embodiment where the memory cells are based on a ReRAM technology, but other embodiments can be based on PCM, MRAM, or other programmable resistance memory cells.

FIG. 14 illustrates a portion of a cross-point, or crossbar, type of memory array. In this example, the word lines run left to right over the bit lines that run obliquely into and out of the page. To sense a selected memory cell 1451, the corresponding selected word line $WL_{sel}$ 1401 and selected bit line $BL_{sel}$ 1411 are biased so that a current flows from the selected from word line $WL_{sel}$ 1401 through memory cell 1451 to bit line $BL_{sel}$ 1411, from where it can be measured to determine the resistance state of the memory cell 1451. This desired current is illustrated by the heavier broken line labelled Ideal Current. However, without the ability to shut off non-selected memory cells, current along other paths, or "sneak paths", can contribute to the sensed current. An example of this is illustrated for the lighter broken line labelled "Sneak Current Path" in FIG. 14, where the current flows from the selected word line $WL_{sel}$ 1401 through non-selected memory cell 1455, down non-selected bit line word line $BL_{unsel}$ 1413, up non-selected memory cell 1457, across non-selected word line word line $WL_{unsel}$ 1403, and down non-selected memory cell 1453 to contribute to the total current on the selected bit line $BL_{sel}$ 1411. Although the sneak path current needs to flow through, in this example, three memory cells (1453, 1455, 1457), if these memory cells are in a low resistance state and the selected memory cell 1451 is in a high resistance state, the unwanted sneak path current could be comparable to, or even higher than, the ideal current through the selected memory cell. This can throw off the sensed current through the selected memory cell in a read operation and such sneak path current can similarly cause program disturbs in non-selected memory cells unless there is a way to such off the current flow though non-selected cells.

One approach to reducing unwanted current paths is to form a memory cell is by placing a transistor in series with the programmable resistive element ("1T1R"), so that the transistor can act as a selector switch for the memory cell. However, the 1T1R arrangement requires, in addition to the area needed for the transistor itself, a control line connected to the control gates of the select transistors as the 1T1R memory cell is a three-terminal device.

Another approach is to use a threshold switching selector, such as an Ovonic Threshold Switch (OTS), in series with the programmable resistive element ("1S1R") to form a memory cell. The 1S1R memory cell is a two terminal device that can be implemented with a small memory cell area and that is highly scalable, achieving high density. FIG. 14 illustrates the use of a threshold switching selector in a cross-point architecture, where each of the memory cells includes a threshold switching selector in series with a programmable resistive element, in this example a ReRAM element, but other embodiments could us MRAM, PCM, or other programmable resistance elements. In the representation of FIG. 14, the resistive element is formed over the threshold switching selector, and the word lines are formed above the memory cells with the bit lines underneath, but either or both of these arrangements can be reversed, depending on the embodiment.

Figure 15:
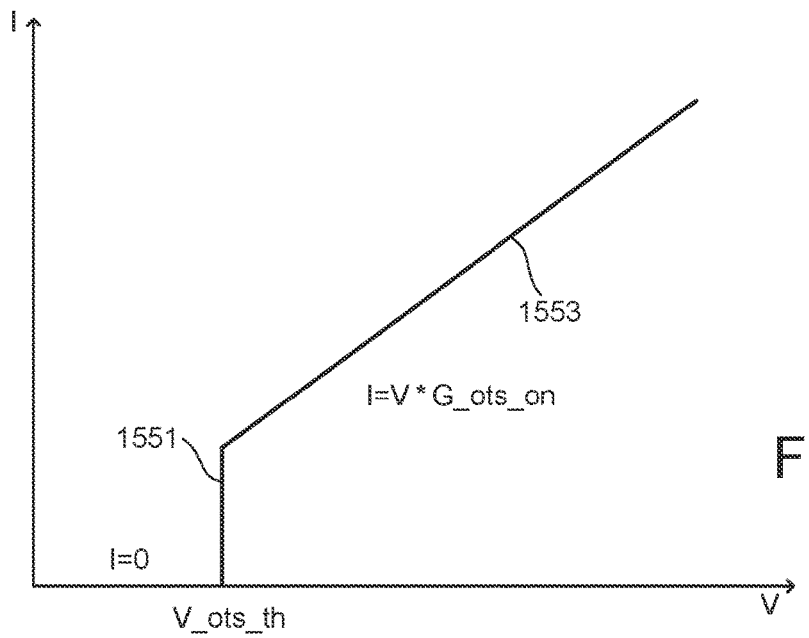
FIG. 15 illustrate the voltage-current behavior for a threshold switching selector, such as formed of an ovonic threshold switching material.

A threshold switching selector, such as an ovonic threshold switch, has a high ON/OFF current ratio, with a high ON current, high endurance and high non-linearity. These can be based on amorphous chalcogenide materials, for example. Such threshold switching selectors can reduce the leakage current, such as through sneak paths illustrated for crossbar arrays, in the memory arrays. The following discussion also presents embodiments of a memory structure that exploits the properties of threshold switching selectors for dropout of nodes of neural networks. FIG. 15 illustrates the behavior of threshold switching selectors in more detail.

FIG. 15 illustrates the voltage-current behavior for a threshold switching selector, such as the ovonic threshold switching material of an OTS. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell; and to read a memory cell, the threshold switching selector similarly must be activated by being turned on before the resistance state of the memory cell can be determined.

For a simple OTS model, as illustrated in FIG. 15, if the applied voltage V is above the threshold voltage, V_ots_th, the selector has an on state conductance (inverse resistance) of G_ots_on and the current I is proportional to the applied voltage, I=V*G_ots_on, as shown at 1553. If the applied voltage is below V_ots_th, the selector is off and I=0, transitioning to the on state (as shown at 1551) once the applied voltage reaches the threshold value (not considering features such as "snapback").

The embodiments described here can use different memory cell technologies (MRAM or PCM, for example) for the programmable resistance elements of the non-volatile memory cells, but the discussion will use a ReRAM example. In a simple ReRAM model, in a static state, such as where being read, in response to an applied voltage V, the current I though a ReRAM element is I=V*G_nvm, where G_nvm is the conductive of the non-volatile memory element. To implement a neural network on a non-volatile memory array, the weights of the neural network are stored in the memory cells as conductance values, so that a weight value w can be approximated as the conductance of the memory cell. As I changes linearly with the weight value at a fixed applied voltage, the product of an input, translated to a voltage Vin gives a current Iout=Vin*w, corresponding to the product of the input and weight value. This allows for the cross-point array of FIG. 14 to implement a fully connected layer of a neural network.

To write a ReRAM memory cell element, a write voltage V_write is placed across the ReRAM element, where the V_write value is high enough to place the ReRAM into a dynamic state. (When the ReRAM element is in series with a threshold switching selector, it is also needed that V_write>V_ots_th, but this is typically the case.) When in the dynamic state the value of the weight w stored in the ReRAM element (i.e., the G_nvm value) changes as $$dw/dt = A^* \sin h(B^* V\_write), \quad \text{(Equation 1)}$$

where A and B are constants dependent on the particular device. Consequently, under this model the stored weight value w increases linearly in time in response to V_write.

Figure 16:
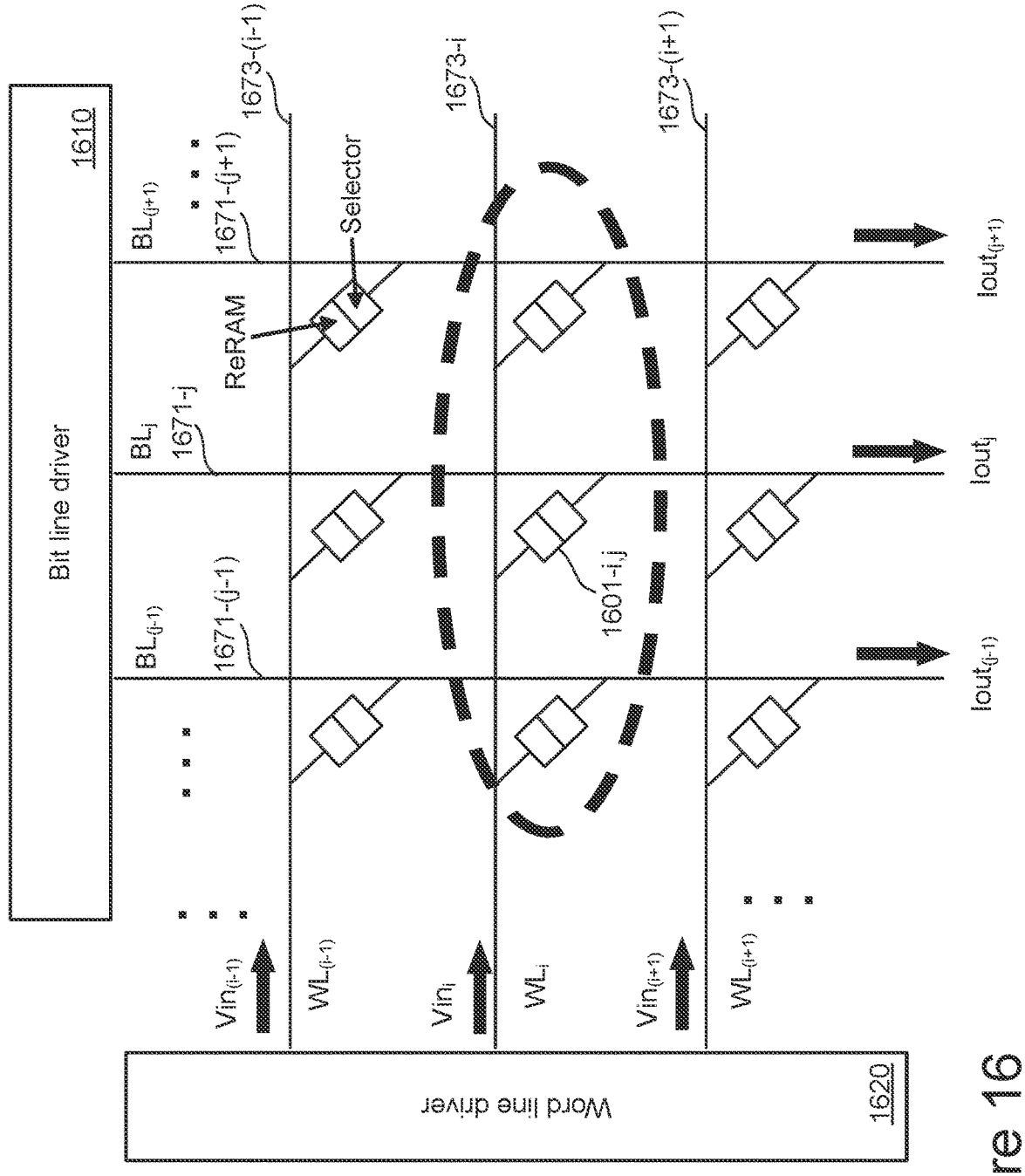
FIG. 16 illustrates an embodiment for an inference scheme using threshold switching selector enabled dropout for a neural network.

FIG. 16 illustrates an embodiment for an inference scheme using threshold switching selector enabled dropout for a neural network. FIG. 16 explicitly represents three word lines ($WL_{(i-1)}$ 1673-(i–1), $WL_i$ 1673-i, $WL_{(i+1)}$ 1673-(i+1)) connected to the word line driver 1620 and three bit lines ($BL_{(j-1)}$ 1671-(j–1), $BL_j$ 1671-j, $BL_{(j+1)}$ 1671-(j+1)) connected to the word line driver 1610. Relative to FIGS. 5 and 6A, the word line driver 1620 can correspond to array drivers 524/624, the bit line driver 1610 can correspond to driver circuit 514/614, and the array of memory cells can correspond to memory array 502/602. At the cross-point between each of the word lines and bit lines is a memory cell 1601, where memory cell 1601-i,j at the cross-point of $WL_i$ 1673-i and $BL_j$ 1671-j is explicitly labelled. Each of the memory cells is formed of a series combination a ReRAM, or other programmable resistance element, portion and a selector portion.

When used during forward propagation in an inference, the weight values of a layer are programmed into the memory cells as conductances and the inputs are converted into voltage values in order to perform an in-memory inferencing. Depending on the embodiment, the weights and input values can be analog values, multi-bit digital values, or binary values. In the following, the discussion is based on an analog implementation. As discussed above with respect to FIG. 12, the output $Output_j$ at a node j is given by the sum $\Sigma_i Input^* w_{i,j}$ of the product of the inputs $Input_i$ and layer's weights $w_{i,j}$. By translating the input values $Input_i$ into input voltages Vin_i on the word lines $WL_i$ 1673-i and storing the weights $w_{i,j}$ as conductances $G_{i,j}$ of the memory cells 1601-i,j, then the current Iout_j on BL_j 1671-j is Iout_j=$\Sigma_i$Vin_i*$G_{i,j}$=$\Sigma_i$ $Input_1 * w_{i,j}$=$Output_j$. The summation over the word lines (i index) can be done by doing all of the inputs at once by concurrently applying the corresponding Vin_i values concurrently, or doing in subsets of one or more word lines at a time and accumulate the results. The more word lines activated at once, the quicker the inference operation, but at the cost of a higher current draw, so that the degree of parallelism used is a design choice based on system requirements and abilities.

Each memory cell 1601-i,j of the array of FIG. 16 is a series combination of a ReRAM (or other programmable resistance) element and a threshold switching selector device. Consequently, if the input voltage on a word line is below the selector's threshold voltage, Vin_i<V_ots_th, OTS is off, so the ith row does not contribute any current to Iout on any of bit lines. Consequently, this is equivalent to the neuron i being dropped out along with its weights (as circled by the broken line in FIG. 16). For Vin_i>V_ots_th, the threshold switching selectors of the row are on, where the conductance of the cells will be that of the series connected threshold switching selector and ReRAM or other non-volatile memory element: I=Vin_i*(G_nvm*G_ots_on)/(G_nvm+G_ots_on), where G_nvm is the conductance of the non-volatile memory device and G_ots_on is the on-state conductance of the threshold switching selector.

Consequently, by choosing the relative values of the Vin values and the V_ots_th value of the threshold switching selectors, the threshold switching selectors can be used to implement dropout of nodes on the neural network. This can be done by designing the memory device to have particular V_ots_th values, adjusting the Vin values relative to the V_ots_th value, or a combination of these.

Figure 17:
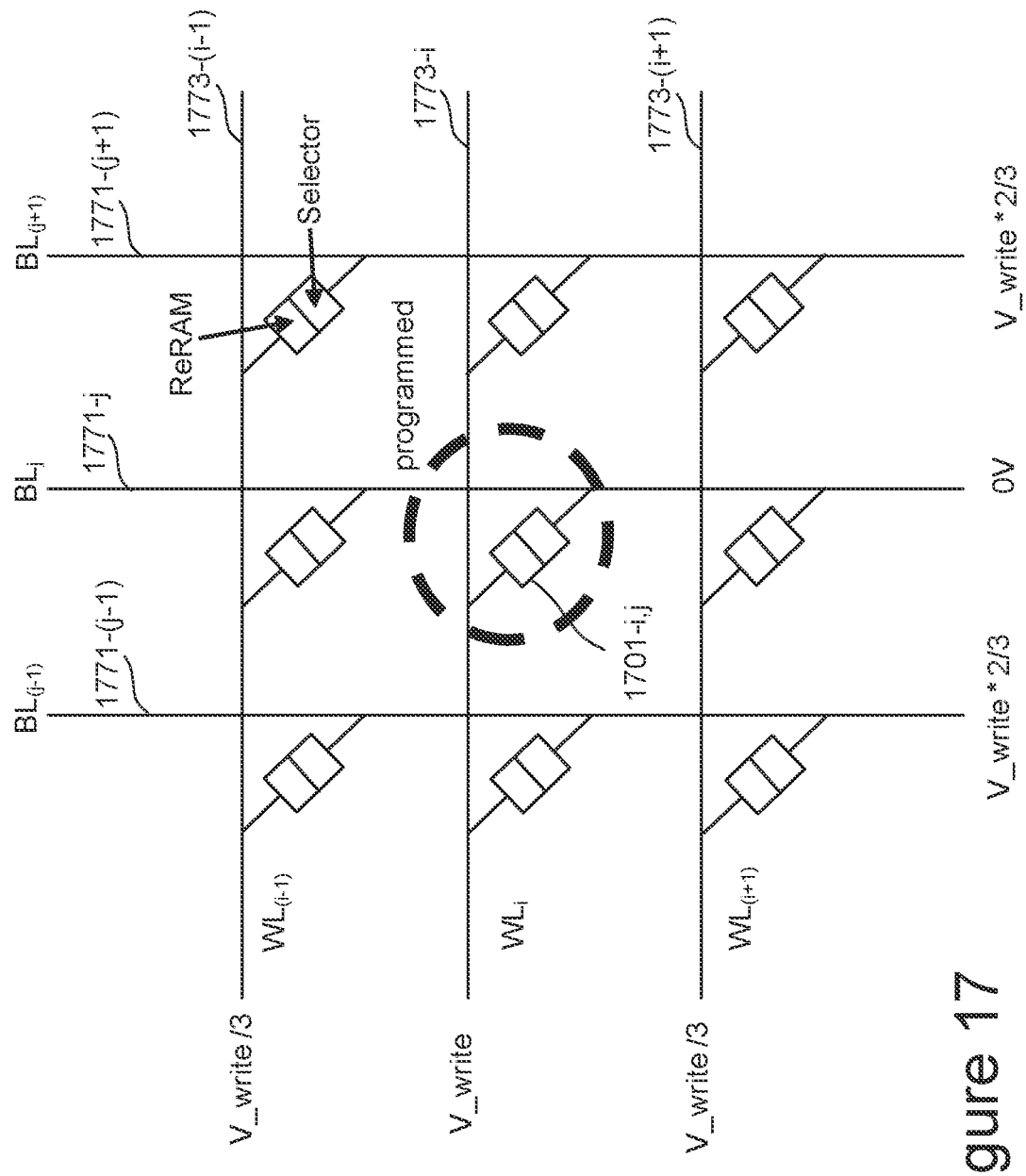
FIG. 17 illustrates an embodiment of a write scheme for programming an individual memory cell that can be used during back propagation.

FIG. 17 illustrates an embodiment of a write scheme for programming an individual memory cell that can be used during back propagation, selectively reprogramming the memory cell based on the output from a forward propagation using dropout. FIG. 17 shows a portion of an array similar to, and similarly numbered as, FIG. 16, but where the word and bit line drivers are not shown. Three word lines ($WL_{(i-1)}$ 1773-(i-1), $WL_i$ 1773-i, $WL_{(i+1)}$ 1773-(i+1)) and three bit lines ($BL_{(j-1)}$ 1771-(j-1), $BL_j$ 1771-j, $BL_{(j+1)}$ 1771-(j+1)) are shown, with a memory cell formed of a ReRAM or other programmable resistance element and a threshold switching selector at each of the cross-points, such as the circled memory cell 1701-i,j at the cross-point of $WL_i$ 1773-i and $BL_j$ 1771-j. The memory cell 1701-i,j in the broken circle is selected for individual programming. To program a selected memory cell 1701-i,j, a write voltage V_write is applied to the selected word line $WL_i$ 1773-i and the selected bit line $BL_j$ 1771-j is set at a low voltage (i.e., ground or 0V).

To program the selected memory cell 1701-i,j, a voltage V_write is applied across the memory cell by driving the word line $WL_i$ 1773-i at V_write and biasing the bit line $BL_j$ 1771-j to 0V. The non-selected word lines and non-selected bit lines are biased at an intermediate voltage between V_write and 0V so that the voltage difference across the non-selected memory cells is not large enough to turn on the threshold switching selector of a non-selected memory cell. In the embodiment illustrated by FIG. 17, the non-selected word lines are biased at ⅓ V_write and the non-selected bit lines are biased at ⅔ V_write, so that if V_ots_th and V_write are such that V_ots_th>V_write/3, the non-selected memory cells will not have their threshold switching selector turned on. Other embodiments can use different intermediate bias levels for the non-selected word lines and bit lines, such as ½ V_write for both of non-selected word and bit lines.

Initially, the threshold switching selector is off, but by biasing the bit lines and the non-selected, and then setting the selected word line at V_write>V_ots_th>V_write/3, the threshold switching selector of selected memory cell 1701-i,j is turned on and the selected memory cell is programmed, but the threshold switching selector of the non-selected memory cell is not turned on. Once threshold switching selector of a selected memory cell is on, the actual voltage drop V_nvm on the ReRAM or other resistive element is V_nvm=V_write*G_ots_on/(G_nvm_+G_ots_on). (For the non-selected memory cells, as V_ots_th>V_write/3 these memory cells will not undergo programming.) The amount of change desired for the stored weight in the memory cell, Δw, is know from the neural network. From Equation 1 above, the pulse duration/number needed to program the resistive element of a selected memory cell at V_write can be determined, with a verify performed with V_nvm to calculate the actual Δw. Note that dropout is not used in the write scheme for the selected memory cell.

Figure 18:
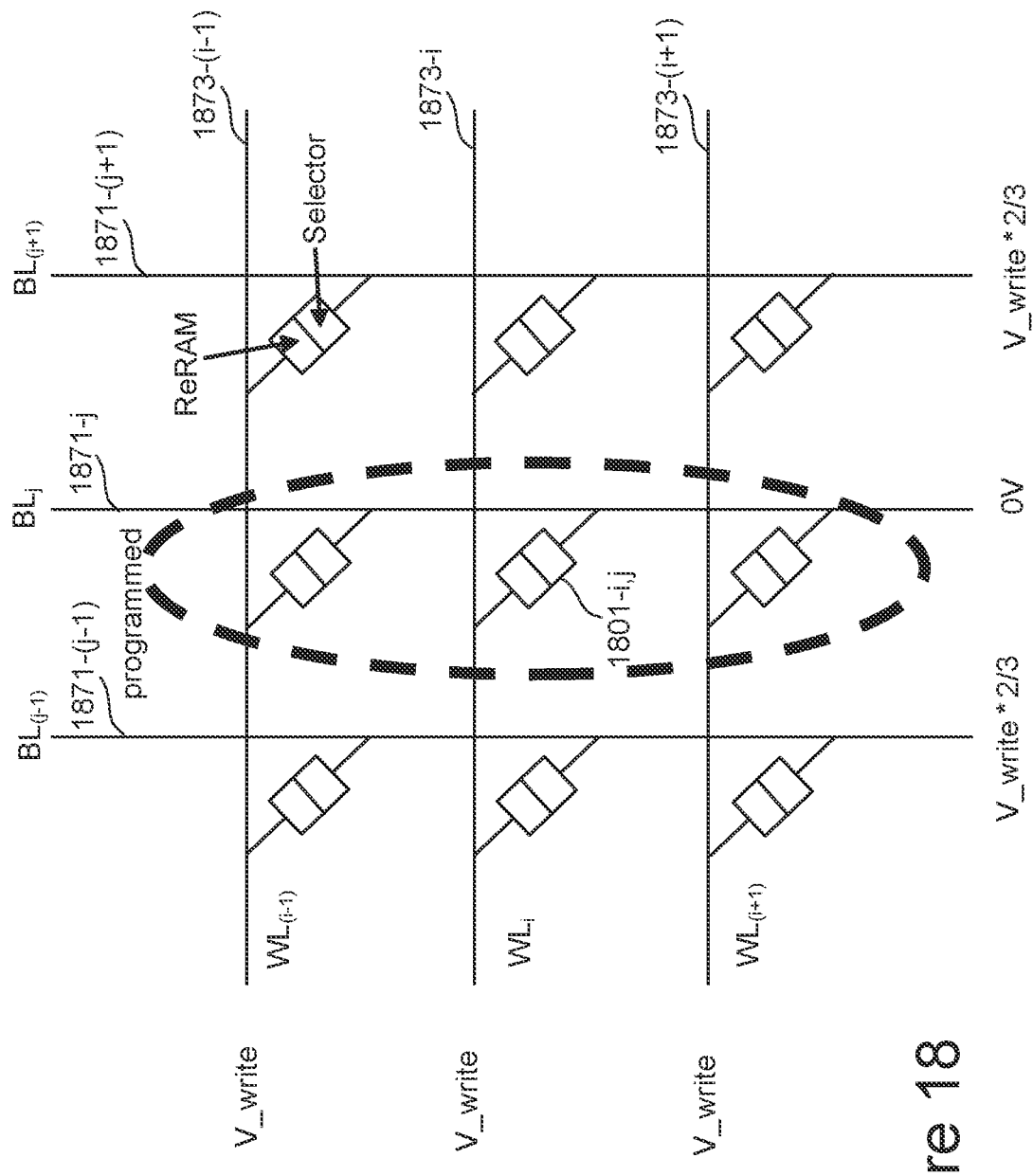
FIG. 18 illustrates an embodiment of a write scheme for concurrently programming a column of memory cell that can be used during back propagation.

FIG. 18 illustrates an embodiment that can be used during back propagation for a write scheme for concurrently programming a column of memory cells, selectively reprogramming the memory cells based on the output from a forward propagation using dropout. FIG. 18 shows the same portion of an array as in FIGS. 16 and 17, and is similarly numbered, but where the word line and bit line numbers are not explicitly shown. Multiple memory cells 1801 of an array can also be written concurrently using a row orientation or, as illustrated in FIG. 18, a column-oriented arrangement. As in FIG. 17, the selected bit line $BL_j$ 1871-j in biased to 0V and the non-selected bit lines (e.g., $BL_{(j-1)}$ 1871-(j-1), $BL_{(j+1)}$ 1871-(j+1)) are set at an intermediate voltage. Unlike FIG. 17, by now applying V_write to multiple word lines (in this example $WL_{(i-1)}$ 1873-(i-1), $WL_i$ 1873-i, $WL_{(i+1)}$ 1873-(i+1)), all of the circled memory cells can be concurrently programmed.

Once the weight values are written or adjusted in a programming operation as described with respect to FIGS. 17 and 18, the input values can be applied to the array and propagated through the network using dropout as described with respect to FIG. 16. The training process can use different V_ots_th values, offset the Vin values, or both to drop out input values since the smaller input values (when Vin<V_ots_th) will be dropped out. For example, in some embodiments up to 50%-70% of the input can be abandoned with less than 5% decrease in accuracy.

Figure 20:
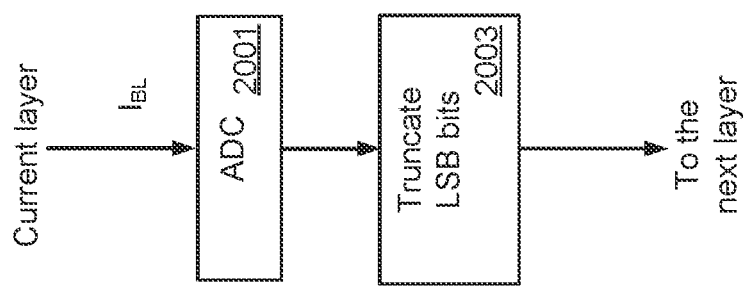
FIGS. 19 and 20 respectively illustrate embodiments for the scaling of bit line current output for a layer of neural network in the analog and digital domain.
Figure 19:
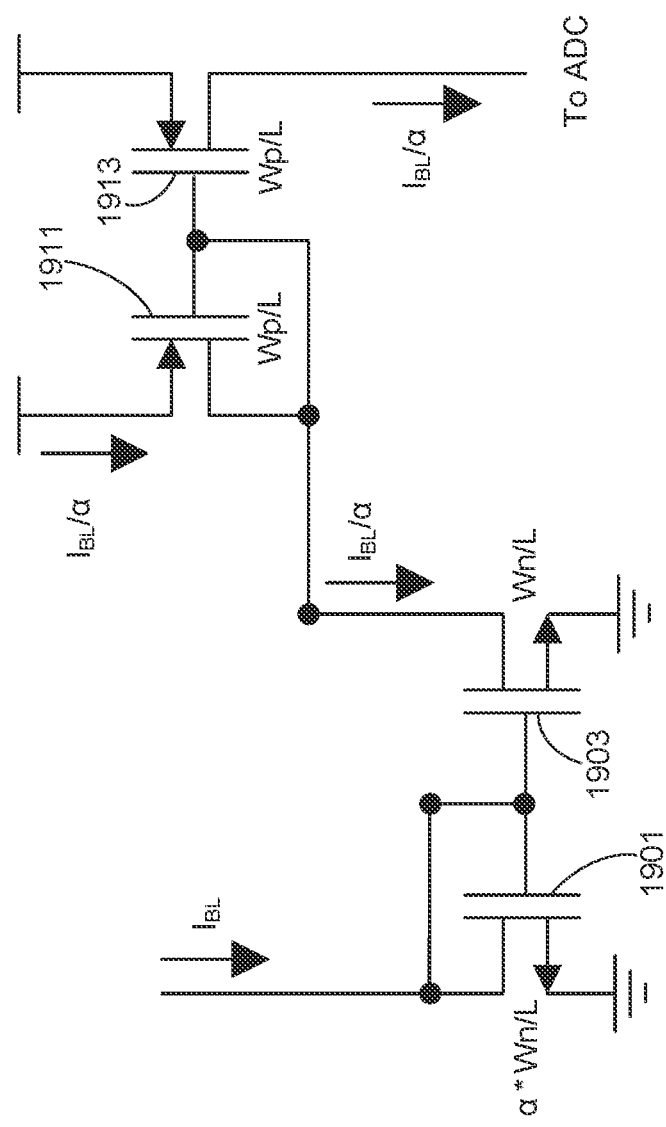

Whether or not an input is dropped out depends upon the voltage level of Vin relative to V_ots_th. The memory device can be designed such that the V_ots_th of the memory devices of the array are optimized for dropout, but once a device is fabricated the V_ots_th value may not be easily dynamically changed. In some embodiments, the inputs to the layers of the neural network can be scaled to effect dropout. FIGS. 19 and 20 illustrate the use of adaptive scaling for the inputs/activations of a layer for a neural network with respect to the threshold voltage V_ots_th of the threshold switching selectors.

FIGS. 19 and 20 respectively illustrate embodiments for the scaling of bit line current output for a layer of neural network in the analog and digital domain. For the input of the initial layer of a neural network, dropout can be effected by the host or controller scaling input values before these are input to the neural network's first layer. For subsequent layers, the output of the preceding layer can be scaled before being provided as input to the subsequent layer.

The embodiment of FIG. 19 scales the bit line current $I_{BL}$ (activation) from one layer in analog domain using a current-steering circuit formed of current mirrors to determine the input for the next layer. More specifically, as discussed above with respect to FIG. 16, the output from an in-memory multiplication between the inputs and weights will be the current level on the bit lines. The output current $I_{BL}$ is input to a diode connected NMOS 1901 that has a width to length ratio of $\alpha$*Wn/L, where $\alpha$>1. The current $I_{BL}$ is mirrored in NMOS 1903 with a width to length ratio of Wn/L that has its control gate connected to the control gate of 1901, such that the current through 1903 is $I_{BL}/\alpha$. The current $I_{BL}/\alpha$ through NMOS 1903 is supplied from the diode connected PMOS 1911 with a width to length ratio of Wp/L. PMOS 1911 is connected in a current mirror arrangement with PMOS 1913, with its control gate commonly connected with that of PMOS 1911 and also having a width to length ratio of Wp/L, so that the output of PMOS 1913 is again $I_{BL}/\alpha$. The output of PMOS 1913 is then provided to an analog to digital converter to serve as an input to the next layer. The reduction of the current $I_{BL}$ by the factor of $\alpha$>1 will lower the resultant Vin for the next layer such that some inputs may be dropped out.

The embodiment of FIG. 20 scales the bit line current $I_{BL}$ (activation) from one layer in the digital domain by truncating a sufficient number of least significant bits (LSB) bits to determine the input for the next layer. In the embodiment of FIG. 20, the analog output current $I_{BL}$ is input to an analog to digital converter ADC 2001 to generate a digital value for $I_{BL}$. A truncate LSB bits 2003 logic circuit can then truncate a number of bits of the digital $I_{BL}$ to reduce its value and effect drop out. Depending on the embodiment, the number bits truncated can be a fixed number or a settable parameter, where the value could be received from a host and stored in a register in the system control logic 560/660.

Figure 21:
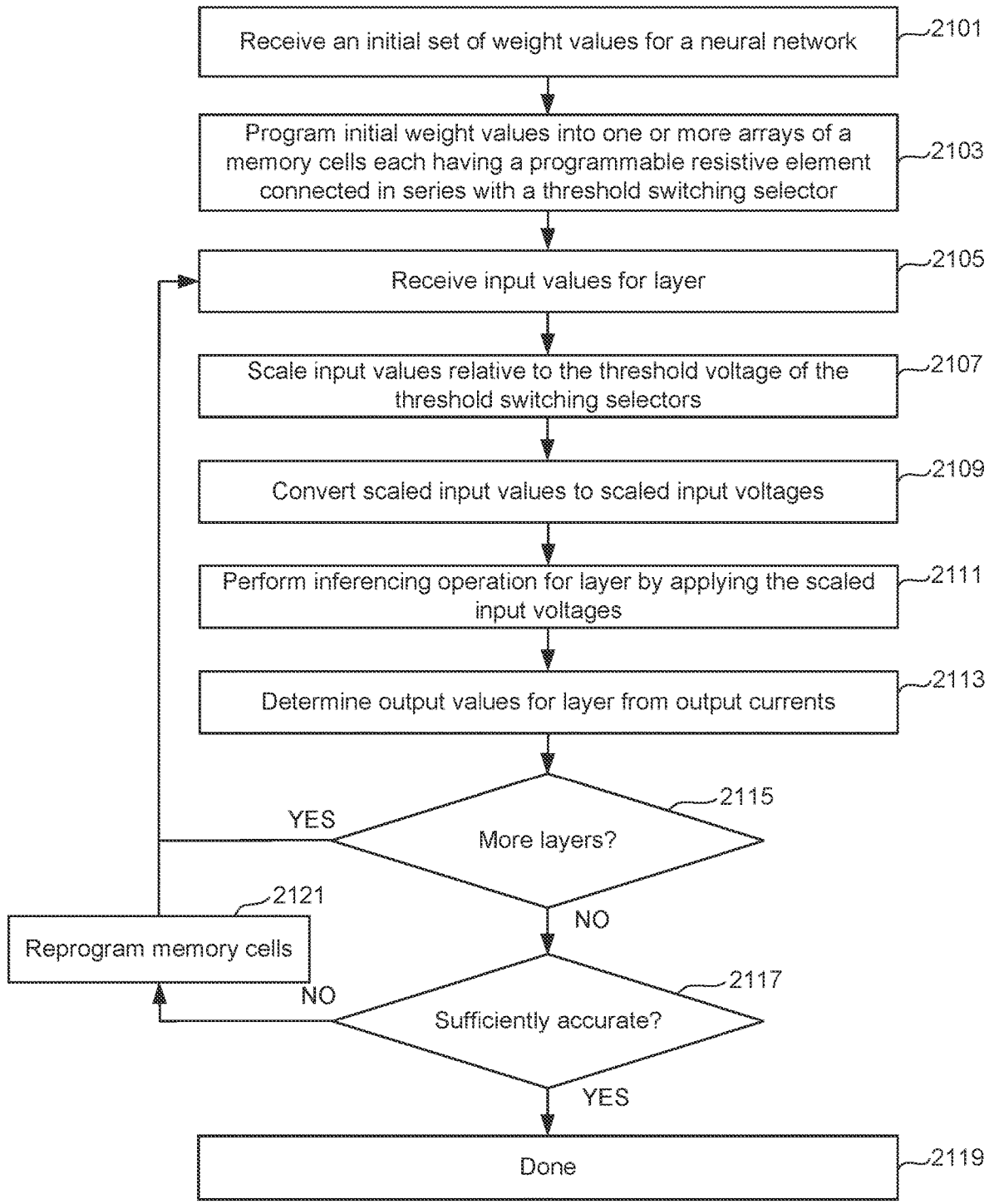
FIG. 21 is a flowchart describing one embodiment of a process for using dropout in neural networks using threshold switching selectors in non-volatile memory devices.

FIG. 21 is a flowchart describing one embodiment of a process for dropout in neural networks using threshold switching selectors in non-volatile memory devices. Relative to FIG. 10B, where the flow of FIG. 21 is used for training, FIG. 21 can be considered a more detailed representation of the process, particularly step 1003, when dropout is included.

Staring a step 2101, the memory device receives an initial set of weight values for one or more layers of a neural network and programs these weight values into one or more arrays of the non-volatile memory device at step 2103. For example, with reference to FIG. 1, a host 120 can provide the initial set of weights to controller 102 of memory device 100, which then transfers them to arrays of the memory dies of one or more of the memory packages 104. Referring to FIGS. 5 and 6A, the weights are then programmed into one or more memory arrays 502/602 of one or more memory die 500/601 by the control circuitry of the system control logic 560/660, row control circuitry 520/620, and column control circuitry 510/610 of memory die 500/control die 611. As described above with respect to FIGS. 16-18, the weight values can be stored as conductance values in ReRAM or other memory cells formed of an OTS or other threshold switching selector in series with the resistive memory element. These initial weight values could be a set of default values (such as a random set of weights or intermediate weight values) or weight values that have trained to some extent. In some cases, a user may receive the memory device with the weights loaded from a previously completed training to use for inferencing, or with an initial set of weights already loaded to use for training (or further training) and would start at step 2105, but the flow of FIG. 21 includes steps for a full training process starting from the weight received at step 2101.

A set of input values are received at step 2105. These input values can be the input values for the initial layer of the neural network and can be received from a host 120 or may already be available on the memory device 100. For example, during a training process (e.g., when looping back from step 2121 below) the input values for the initial layer may have previously been received and stored, for example, in the local memory 106 or other location on the memory device 100. For layers after the first layer of the neural network, the input of one layer will be the output (or derived from the output) of a preceding layer. As with the weights, depending on the embodiment the input values can be analog, multi-bit, or binary values. When the output of one layer is used as the input of a subsequent layer, it will be understood that, depending on the context the output can be a raw output (such as the bit line current values) or may have undergone some processing, such as being digitized in an ADC, going through an activation function, and so on.

Step 2107 scales the input values relative to the threshold voltage of the threshold switching selectors to implement dropout. Examples of scaling are described above with respect to FIG. 19, where the bit line currents are scaled through the relative transistor sizes of the current mirror elements, and FIG. 20, where digitized values are truncated. The scaled output values are then converted to input voltage values by the control circuits, such as illustrated for the word line drivers 1620 in FIG. 16. In terms of the order of steps 2107 and 2109, depending on the embodiment, the scaling of step 2107 can be performed before or after the conversion of step 2109. In some cases, the scaling can at other points in the process, such as the host 120 scaling an initial set of input before supplying these to the memory system.

An in-memory inferencing operation is then performed at step 2111 by applying the scaled set of input voltages to the array or arrays of the memory cells storing the weight values of the layer. As illustrated in the embodiment of FIG. 16, the input voltages Vin are applied to word lines 1673-*i* of the array, resulting in the output currents Iout on bit lines 1673-*j*, where the outputs for the layer at step 2113 can correspond to, or be derived from, the output currents.

At step 2115 the control circuits (e.g., system control logic 560/660, memory controller 102, or some combination of these) determine whether there are more layers and, if so, the flow loops back to step 2105 with the output (or result derived from the output) serving as in the input of step 2105 for the next layer. If the output from step 2113 is from the last layer of the inference, the flow moves on to step 2117 if the inference is part of a training operation; and if not an inferencing operation, the output of step 2111 would be the final output. At step 2117 (if being used in a training operation), a determination is made on whether the neural network with the current set of weight values is sufficiently accurate and, if so, the flow ends at step 2119. If not, at step 2121 the weights can be adjusted by reprogramming one or more memory cells as described with respect to back propagation in FIGS. 17 and 18 and then looping back to step 2105 to run the input values through the neural network with the adjusted weight values.

The embodiments described here can provide power by reducing, through dropout, the number of active nodes so that less current is conducted. By dropping out smaller value inputs as enabled by the threshold cutoff of threshold switching selectors, the embodiments presented above can achieve lower dropout rates (fewer active nodes) than the traditional random dropout method. Therefore, the system can increase the sparsity of the neural network and lower the power consumption, and do so with a small footprint as threshold switching selectors do not require the extra select lines need in a 1T1R arrangement. In particular, the use of scale and shift circuits can be used to modify the input to achieve different dropout rates at fixed threshold switching selector thresholds.

According to a first set of aspects, a non-volatile memory device includes a control circuit configured to connect to one or more arrays of non-volatile memory cells connected along word lines and bit lines. Each memory cell includes a programmable resistive element connected in series with a threshold switching selector that is configured to become conductive in response to application of a voltage level exceeding a threshold voltage. The control circuit is configured to: receive a set of input values for a first layer of a neural network; scale the set of input values relative to the threshold voltage of the threshold switching selectors; convert the set of scaled input values to a corresponding set of scaled input voltages; perform an inferencing operation for the first layer of the neural network by applying the scaled set of input voltages to word lines of a first of the arrays storing weight values of the first layer of the neural network in the memory cells thereof; and determine a set of output values for the first layer of the neural network from a corresponding set of output currents on the bit lines of the first array.

In additional aspects, a method includes receiving a set of input values for a first layer of a neural network at an array of a plurality of non-volatile memory cells each comprising a programmable resistive element connected in series with a threshold switching selector, the programmable resistive element storing a weight value of the first layer of the neural network and the threshold switching selector configured to become conductive in response to application of a voltage level exceeding a threshold voltage. The method also includes: scaling the set of input values relative to the threshold voltage of the threshold switching selectors; converting the set of scaled input values to a corresponding set of scaled input voltages; performing an inferencing operation for the first layer of the neural network by applying the scaled set of input voltages to the first of the array; and determining a set of output values for the first layer of the neural network from a corresponding set of output currents on the bit lines of the array.

In another set of aspects, a non-volatile memory device includes: a first array of non-volatile memory cells each storing a weight value of a first layer of a neural network; a second array of non-volatile memory cells each comprising a programmable resistive element connected in series with a threshold switching selector, the programmable resistive element storing a weight value of a second layer of the neural network and the threshold switching selector configured to become conductive in response to application of a voltage level exceeding a threshold voltage; and one or more control circuits connected to the first array and to the second array. The one or more control circuits are configured to: receive a set of output values of the first array in response to a set of input values for the first layer of the neural network; scale the set of output values of the first layer relative to the threshold value; convert the scaled set of output values of the first layer to a corresponding set of input voltage values for the second layer of the neural network; apply the set of input voltages to the second array; and determine a set of output values for the second layer of the neural network based on a corresponding set of output current from the second array in response to the set of input voltages.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
  a control circuit configured to connect to one or more arrays of non-volatile memory cells connected along word lines and bit lines, each memory cell comprising a programmable resistive element connected in series with a threshold switching selector configured to become conductive in response to application of a voltage level exceeding a threshold voltage, the control circuit is configured to:
    receive a set of input values for a first layer of a neural network;
    scale the set of input values relative to the threshold voltage of the threshold switching selectors;
    convert the set of scaled input values to a corresponding set of scaled input voltages;
    perform an inferencing operation for the first layer of the neural network by applying the scaled set of input voltages to word lines of a first of the arrays storing weight values of the first layer of the neural network in the memory cells thereof; and
    determine a set of output values for the first layer of the neural network from a corresponding set of output currents on the bit lines of the first array.

2. The non-volatile memory device of claim 1, wherein the control circuit is formed on a control die, the non-volatile memory device further comprising:
  a memory die including the one or more of the arrays of non-volatile memory cells, the memory die formed separately from and bonded to the control die.

3. The non-volatile memory device of claim 1, wherein the control circuit is further configured to:
  receive the weight values of the first layer of the neural network; and program the weight values of the first layer of the neural network in the memory cells of the first array.

4. The non-volatile memory device of claim 1, wherein the control circuit is further configured to:
reprogram one or more of the weight values of the first layer of the neural network in the memory cells of the first array based on the set of output values of the first layer.

5. The non-volatile memory device of claim 1, the control circuit comprising:
a plurality of current-steering circuits each configured to receive a corresponding one of the set of output currents, scale the corresponding output current, and provide the corresponding scaled output current as a corresponding one of the set of output values for the first layer of the neural network,
wherein the control circuit is further configured to:
provide the set of output values for the first layer of the neural network as inputs to a second layer of the neural network.

6. The non-volatile memory device of claim 1, wherein the control circuit is further configured to:
digitize the set of output currents to determine a digitized value for each of the output currents;
determine the set of output values for the first layer of the neural network by truncating a number of least significant bits from the digitized values of the output currents; and
provide the set of output values for the first layer of the neural network as inputs to a second layer of the neural network.

7. The non-volatile memory device of claim 1, wherein the input values for the first layer of the neural network and the weight values for the first layer of the neural network are analog values.

8. The non-volatile memory device of claim 1, further comprising:
the one or more arrays of non-volatile memory cells, wherein the programmable resistive element comprises a resistive random-access memory (ReRAM) device.

9. The non-volatile memory device of claim 1, further comprising:
the one or more arrays of non-volatile memory cells, wherein the programmable resistive element comprises a magnetic random-access memory (MRAM) device.

10. The non-volatile memory device of claim 1, further comprising:
the one or more arrays of non-volatile memory cells, wherein the threshold switching selector comprises an ovonic threshold switch (OTS).

11. A method, comprising:
receiving a set of input values for a first layer of a neural network at an array of a plurality of non-volatile memory cells each comprising a programmable resistive element connected in series with a threshold switching selector, the programmable resistive element storing a weight value of the first layer of the neural network and the threshold switching selector configured to become conductive in response to application of a voltage level exceeding a threshold voltage;
scaling the set of input values relative to the threshold voltage of the threshold switching selectors;
converting the set of scaled input values to a corresponding set of scaled input voltages;
performing an inferencing operation for the first layer of the neural network by applying the scaled set of input voltages to the first of the array; and
determining a set of output values for the first layer of the neural network from a corresponding set of output currents on bit lines of the array.

12. The method of claim 11, further comprising:
reprogramming one or more of the weight values of the first layer of the neural network in the memory cells of the array based on the set of output values of the first layer.

13. The method of claim 11, wherein the input values for the first layer of the neural network are digital values and scaling the set of input values relative to the threshold voltage of the threshold switching selectors comprises:
truncating a number of least significant bits from the digital values of the input values for the first layer of the neural network.

14. The method of claim 11, wherein the input values for the first layer of the neural network are analog current values and scaling the set of input values relative to the threshold voltage of the threshold switching selectors comprises:
scaling analog current values in a current mirror.

15. The method of claim 11, further comprising:
prior to receiving the set of input values for a first layer of the neural network, programming the weight values of the first layer of the neural network in the memory cells of the array.

16. The method of claim 13, further comprising:
providing the set of output values for the first layer of the neural network as inputs to a second layer of the neural network.

17. The method of claim 14, further comprising:
providing the set of output values for the first layer of the neural network as inputs to a second layer of the neural network.

18. The method of claim 11, wherein the input values for the first layer of the neural network and the weight values for the first layer of the neural network are analog values.

19. The method of claim 11, wherein the programmable resistive element comprises a magnetic random-access memory (MRAM) device.

20. The method of claim 11, wherein the threshold switching selector comprises an ovonic threshold switch (OTS).

* * * * *